United States Patent
Seo et al.

(10) Patent No.: US 10,663,647 B2
(45) Date of Patent: May 26, 2020

(54) BACKLIGHT UNIT, DISPLAY DEVICE AND MANUFACTURING METHOD OF DISPLAY DEVICE

(71) Applicant: Samsung Display Co. Ltd., Yongin-si (KR)

(72) Inventors: Woo Suk Seo, Yongin-si (KR); Kwang Wook Choi, Cheonan-si (KR); Yong Hoon Kwon, Hwaseong-si (KR); Sung Chul Kim, Seongnam-si (KR); Seok Hyun Nam, Seoul (KR); Si Joon Song, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 140 days.

(21) Appl. No.: 15/809,604

(22) Filed: Nov. 10, 2017

(65) Prior Publication Data

US 2018/0149807 A1  May 31, 2018

(30) Foreign Application Priority Data

Nov. 30, 2016  (KR) .......................... 10-2016-0161275

(51) Int. Cl.
*F21V 8/00* (2006.01)
*G02F 1/13357* (2006.01)
*H01L 33/50* (2010.01)

(52) U.S. Cl.
CPC ........... *G02B 6/0088* (2013.01); *G02B 6/005* (2013.01); *G02B 6/0023* (2013.01); *G02B 6/0026* (2013.01); *G02B 6/0091* (2013.01); *G02F 1/1336* (2013.01); *G02F 1/133615* (2013.01); *G02B 6/009* (2013.01); *G02B 6/0055* (2013.01); *G02B 6/0065* (2013.01); *G02F 2001/133614* (2013.01); *H01L 33/507* (2013.01)

(58) Field of Classification Search
CPC .. G02B 6/0088; G02B 6/0055; G02B 6/0023; G02B 6/0026; G02B 6/005; G02B 6/0091; G02B 6/0065; G02B 6/009; G02F 1/1336; G02F 1/133615
See application file for complete search history.

(56) References Cited

U.S. PATENT DOCUMENTS

| | | | |
|---|---|---|---|
| 10,073,211 B1* | 9/2018 | Almanza-Workman | ..................... G02B 6/0083 |
| 2002/0043012 A1* | 4/2002 | Shibata | .................. B60Q 1/323 40/546 |
| 2007/0046859 A1* | 3/2007 | Huang | ................. G02B 6/0086 349/65 |

(Continued)

FOREIGN PATENT DOCUMENTS

| | | |
|---|---|---|
| EP | 2737345 | 6/2014 |
| EP | 3352004 | 7/2018 |

(Continued)

OTHER PUBLICATIONS

Extended European Search Report—European patent application No. 17203939.8 dated Aug. 16, 2018, citing references listed within.

*Primary Examiner* — Anabel Ton
(74) *Attorney, Agent, or Firm* — Cantor Colburn LLP

(57) ABSTRACT

A backlight unit includes a light guide plate; a wavelength conversion member disposed on a surface of the light guide plate; and a housing which houses the wavelength conversion member and is fused to the light guide plate.

21 Claims, 35 Drawing Sheets

(56) References Cited

U.S. PATENT DOCUMENTS

| | | | | |
|---|---|---|---|---|
| 2007/0064448 A1* | 3/2007 | Yu | ............... | G02B 6/0065 |
| | | | | 362/633 |
| 2009/0067193 A1* | 3/2009 | Noh | ............... | G02B 6/0065 |
| | | | | 362/613 |
| 2011/0026240 A1* | 2/2011 | Hayashi | ............... | G02B 6/0065 |
| | | | | 362/97.1 |
| 2014/0043558 A1* | 2/2014 | Hwang | ............... | G02B 6/0095 |
| | | | | 349/58 |
| 2014/0063847 A1* | 3/2014 | Sakamoto | ............ | G02B 6/0031 |
| | | | | 362/609 |
| 2014/0267972 A1* | 9/2014 | Ishiwata | ............... | G02B 6/005 |
| | | | | 349/58 |
| 2015/0124483 A1* | 5/2015 | Lee | ............ | G02F 1/133608 |
| | | | | 362/612 |
| 2015/0219311 A1 | 8/2015 | Cho et al. | | |
| 2015/0362654 A1 | 12/2015 | Sadasivan et al. | | |
| 2017/0198881 A1* | 7/2017 | McCreary, Jr. | ....... | F21V 7/0008 |
| 2019/0204498 A1* | 7/2019 | Lee | ............... | G02B 6/0051 |

FOREIGN PATENT DOCUMENTS

| | | |
|---|---|---|
| KR | 1020120126394 | 11/2012 |
| KR | 1020150092798 | 8/2015 |
| KR | 1020150096564 | 8/2015 |
| KR | 1020160009720 | 1/2016 |
| KR | 1020160082635 | 7/2016 |
| KR | 1020180008971 | 1/2018 |

* cited by examiner

BACKLIGHT UNIT, DISPLAY DEVICE AND MANUFACTURING METHOD OF DISPLAY DEVICE

This application claims priority to Korean Patent Application No. 10-2016-0161275 filed on Nov. 30, 2016, and all the benefits accruing therefrom under 35 U.S.C. § 119, the content of which in its entirety is herein incorporated by reference.

BACKGROUND

1. Field

Embodiments of the invention relate to a backlight unit, a display device including the backlight unit, and a method of manufacturing the display device.

2. Description of the Related Art

A liquid crystal display device has played an important role in information display techniques. The liquid crystal display device may display information, by providing liquid crystals inserted between glass substrates, by providing electrodes located above and below the glass substrates to apply voltages through power sources, and by controlling electric fields between the electrodes in each liquid crystal to emit light.

Since such a liquid crystal display device is a light-receiving element which does not emit light independently and displays an image by adjusting the transmittance of light incident from an outside of a display panel, a separate device for irradiating the display panel with light, that is, a backlight unit is used.

Recently, a light-emitting diode ("LED") has received much attention as a light source of a backlight unit of the liquid crystal display device, and the LED is a semiconductor light-emitting device that emits light when current flows therethrough. The LED is widely used as a backlight unit of a lighting device, an electronic bulletin board, a display device and the like due to long life expectancy, low-power consumption, rapid response speed and desired initial driving characteristics, and application fields thereof are increasingly expanded.

In an LED light source, quantum dots may be used to increase color purity. The quantum dots emit electrons, while transitioning from the conduction band to the valence band in the excited state. The quantum dots exhibit characteristics in which the wavelength changes depending on the size of the particle even in the case of the same substance. As the sizes of the quantum dots become smaller, light of a shorter wavelength is emitted. Accordingly, it is possible to obtain light of a desired wavelength region by adjusting the size of the quantum dots.

SUMMARY

Since a quantum dot substance is mainly in a state of being sealed inside a sealing material such as glass, there is a risk of damage to the sealing material caused by external impact. Further, since a component such as Cr is contained inside the quantum dot substance, the component may cause environmental pollution when flowing out to the outside. Therefore, recently, research is being carried out to prevent damage to the sealing material which seals the quantum dot substance, while achieving white light of high color reproduction ratio using the quantum dot substance.

An embodiment of the invention relates to a backlight unit in which an alignment of elements thereof is effectively maintained.

Another embodiment of the invention relates to a backlight unit in which the number of components is decreased.

Still another embodiment of the invention relates to a display device in which an alignment of elements thereof is effectively maintained.

Still another embodiment of the invention relates to a display device in which the number of components is decreased.

Still another embodiment of the invention relates to a manufacturing method of a display device in which an alignment of elements thereof is effectively maintained.

Still another embodiment of the invention relates to a manufacturing method of a display device in which the number of components is decreased to improve productivity.

According to an embodiment of the invention, a backlight unit includes a light guide plate; a wavelength conversion member disposed on a surface of the light guide plate; and a housing which houses the wavelength conversion member and is bonded to the light guide plate.

In an embodiment, the surface of the light guide plate may include an upper surface, a lower surface facing the upper surface, and a side surface which connects the upper surface with the lower surface.

In an embodiment, the housing may be bonded to a side surface of the light guide plate.

In an embodiment, the housing may include a protrusion protruded from a side surface of the housing, and the protrusion may be bonded to the upper surface of the light guide plate.

In an embodiment, the side surface of the light guide plate may be in contact with the housing and the wavelength conversion member.

In an embodiment, a groove may be defined on the side surface of the light guide plate, and the wavelength conversion member may be filled in the groove on the side surface of the light guide plate.

In an embodiment, the housing may be bonded to the upper surface.

In an embodiment, a groove may be defined on the upper surface of the light guide plate, and the wavelength conversion member may be filled in the groove on the upper surface of the light guide plate.

In an embodiment, the housing and the side surface of the light guide plate are directly in contact with each other to form a contact surface, and a bonding portion of the housing and the light guide plate may be formed on the contact surface.

In an embodiment, the bonding portion may include a plurality of bonding dots.

In an embodiment, each of the bonding dots may include a central region and a peripheral region disposed outside the central region.

In an embodiment, the width of the central region may be in a range of about 10 micrometers (μm) to about 20 μm.

In an embodiment, the width of the peripheral region may be in a range of about 70 μm to about 100 μm.

In an embodiment, a plurality of trenches may be defined in the housing, and the wavelength conversion member may be filled in the trenches.

In an embodiment, the housing may include a cover glass which covers the trenches.

In an embodiment, the light guide plate and the housing may include a glass.

According to another embodiment of the invention, a display device includes a backlight unit, and a display panel disposed on the backlight unit, wherein the backlight unit includes a light guide plate; a wavelength conversion member disposed on a surface of the light guide plate; and a housing which houses the wavelength conversion member and is bonded to the light guide plate.

In an embodiment, the housing may be bonded to the display panel.

In an embodiment, the housing may further include a first protrusion protruded from a surface thereof, and the first protrusion may be bonded to the display panel.

In an embodiment, the housing may further include a second protrusion protruded from an opposing surface thereof, which is opposite to the surface, and the second protrusion may be bonded to the display panel.

In an embodiment, the light guide plate may be bonded to the display panel.

In an embodiment, the housing may be bonded to an upper surface of the light guide plate, and the display panel may be bonded to the housing.

According to another embodiment of the invention, a method for manufacturing a display device includes preparing a light guide plate, a wavelength conversion member to be disposed on a surface of the light guide plate, and a housing which house the wavelength conversion member and is to be in contact with the light guide plate; and bonding the light guide plate and the housing to each other using a femtosecond laser.

In an embodiment, the method may further include assembling the bonded light guide plate and the housing, which are bonded to each other, with a display panel.

In an embodiment, the method may further include assembling the bonded light guide plate and the housing, which are bonded to each other, with a lower cover.

According to embodiments of the invention, an occurrence of misalignment between the wavelength conversion member and the light guide plate is effectively prevented by fixing the wavelength conversion member and the light guide plate to each other. If the alignment is not performed properly, the light incident efficiency and the color conversion ratio may decrease. In such embodiments, the alignment between the wavelength conversion member and the light guide plate is fixed, such that a phenomenon of decreases in light incident efficiency and the color conversion ratio is effectively prevented.

In such embodiment, a manufacturing method thereof is simplified by reducing the number of parts, thereby improving the productivity of the product.

BRIEF DESCRIPTION OF THE DRAWINGS

The above and other aspects and features of the invention will become more apparent by describing in detail exemplary embodiments thereof with reference to the attached drawings, in which.

DETAILED DESCRIPTION

Figure 1:
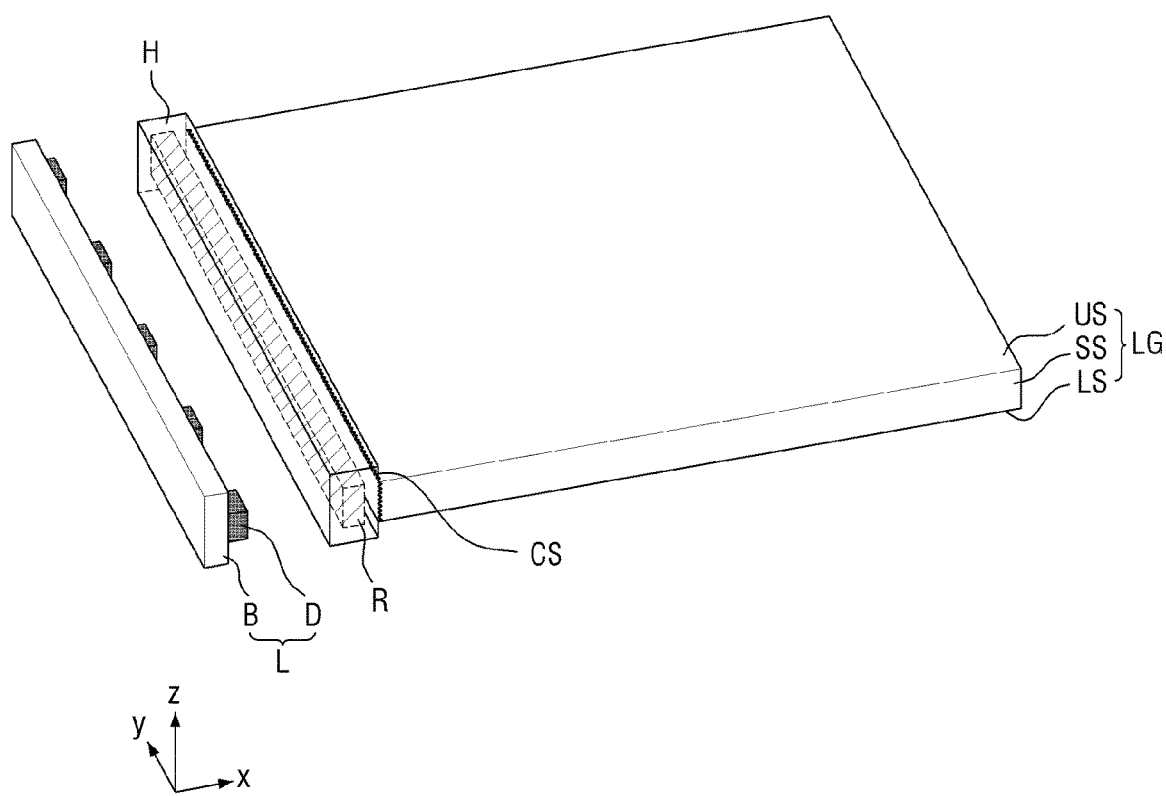
FIG. 1 is a perspective view of a backlight unit according to an embodiment of the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
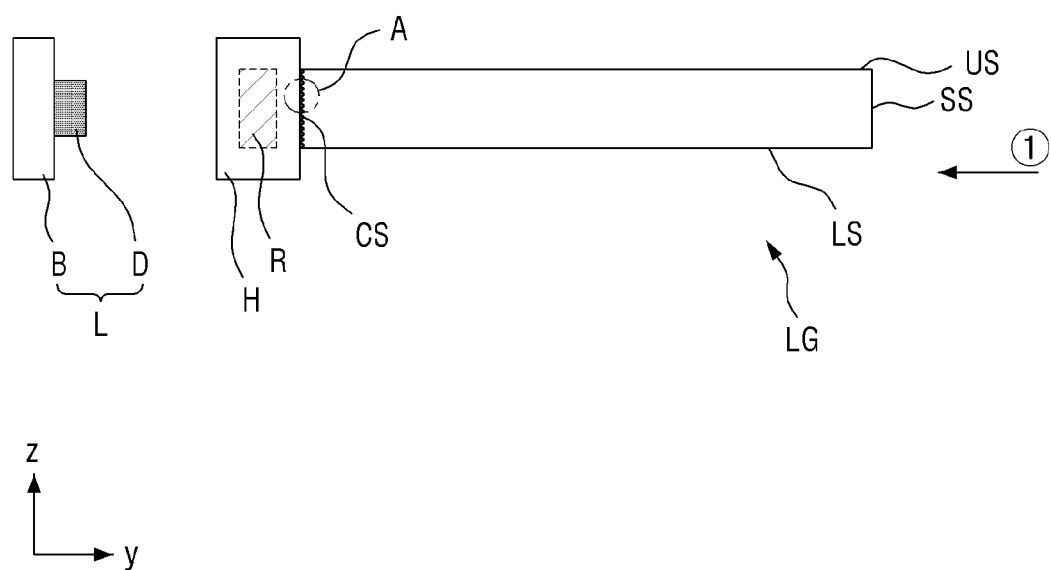
FIG. 2 is a side view of the embodiment of FIG. 1.

FIG. 1 is a perspective view of a backlight unit according to an embodiment of the invention. FIG. 2 is a side view of the embodiment of FIG. 1.

Referring to FIGS. 1 and 2, an embodiment of a backlight unit includes a light source L, a light passing part, a wavelength conversion member R disposed on a side surface of the light passing part, and a housing H that houses the light guide plate R and is fused to the light passing part.

In an embodiment, the light passing part may include the light guide plate LG.

The light guide plate LG may guide and provide the light from the light source L to a display panel (not illustrated) to be described later.

In an embodiment, the light guide plate LG may include an upper surface US and a lower surface LS facing each other, and a side surface SS which connects the upper surface US and the lower surface LS.

Light provided from the light source L to the light guide plate LG may be emitted via the upper surface US of the light guide plate LG. In such an embodiment, the light guide plate LG may guide the light provided from the light source L so that the light can travel toward the upper surface US or via the upper surface. In such an embodiment, the upper surface US may be a light-emitting surface.

FIG. 1 illustrates an embodiment where the upper surface US includes a flat surface, but the shape of the upper surface US is not limited thereto. Alternatively, a functional pattern for performing the optical function may be defined on the upper surface US. This functional pattern may include a plurality of protruding patterns or recessed patterns.

The lower surface LS may be disposed to face the upper surface US. The lower surface LS may have substantially the same shape as the upper surface US and may be disposed opposite to the upper surface US.

The lower surface LS may reflect or scatter the light provided from the light source L so that the light travels toward the upper surface US.

FIG. 1 illustrates an embodiment where the lower surface LS is a flat surface, but the shape of the lower surface LS is not limited thereto. In an alternative embodiment, a plurality of functional patterns may be defined on the lower surface LS. In such an embodiment, as described above, the functional pattern may be a pattern for performing a reflection and/or scattering function, and its shape and number are not limited.

The side surface SS may be disposed between the upper surface US and the lower surface LS. In an embodiment, the side surface SS may connect the upper surface US and the lower surface LS.

In an embodiment, the light guide plate LG may include one or more side surfaces SS. In one embodiment, for example, the light guide plate LG has a rectangular parallelepiped shape as illustrated in FIG. 1, and four side surfaces SS may exist. In such an embodiment, the side surface SS may include two short side surfaces facing each other, and two long side surfaces facing each other.

In an embodiment, the light source L, which will be described later in greater detail, may be disposed to be adjacent to a short side surface of the light guide plate LG. In such an embodiment, the short side surface adjacent to the light source of the light guide plate LG becomes a light incident surface, and the short side surface facing the light incident surface may become an opposing surface.

FIG. 1 illustrates an embodiment where the short side surface extends in the y-axis direction and the long side surface extends in the x-axis direction.

Also, FIG. 1 illustrates an embodiment where the side surface includes a flat surface, but the invention is not limited thereto. In an alternative embodiment, the side surfaces may include an inclined surface.

In an embodiment, the light guide plate LG may be a glass light guide plate including glass.

A wavelength conversion member R may be disposed on a side of the light guide plate LG. FIG. 1 illustrates an embodiment where the wavelength conversion member R is adjacent to the side surface SS, e.g., the light incident surface, of the light guide plate LG.

Light provided from the light source L may be provided to the light guide plate LG through the wavelength conversion member R In an embodiment, the light having passed through the wavelength conversion member R may be provided to the light guide plate LG after its wavelength is converted into white light. In such an embodiment, the wavelength conversion member R may shift the wavelength of the light passing therethrough. In such an embodiment, the wavelength conversion member R may include quantum dots QD.

Quantum dots included in the wavelength conversion member R may include, for example, at least one of Si-based nanocrystal, group II-VI compound semiconductor nanocrystal, group III-V compound semiconductor nanocrystal, group IV-VI compound semiconductor nanocrystal and mixtures thereof.

In an embodiment, the group II-VI compound semiconductor nanocrystal may include at least one selected from CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HggZnTe, CdZnSeS, CdZnSeTe, CdZnSTe, CdHgSeS, CdHgSeTe, CdHgSTe, HgZnSeS, HgZnSeTe and HgZnSTe.

In an embodiment, the group III-V compound semiconductor nanocrystal may include at least one selected from GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs and InAlPAs.

In an embodiment, the group IV-VI compound semiconductor nanocrystal may include SbTe. However, this is merely exemplary, and the type of the quantum dot substance is not limited thereto. In such an embodiment, any quantum dot substance may be used as the quantum dot belonging to the wavelength conversion member R, as long as the quantum dot substance performs the wavelength conversion function.

In an embodiment, the wavelength conversion member R has a bar shape and may extend in a longitudinal direction or a y-axis direction. FIG. 1 illustrates an embodiment where the wavelength conversion member R extends in the y-axis direction. In such an embodiment, the wavelength conversion member R may extend along a side surface SS of the light guide plate LG. In an embodiment, the wavelength conversion member R may be arranged to be adjacent to the light-emitting surface of the short side surfaces of the light guide plate LG, that is, the side surface SS adjacent to or facing the light source L.

The wavelength conversion member R may continuously extend in a single direction. However, the invention is not limited thereto, and in an alternative embodiment, the wavelength conversion member R may intermittently extend. FIG. 1 illustrates an embodiment where a single wavelength conversion member R is integrally formed as single unit, but the invention is not limited thereto. In an alternative embodiment, a plurality of wavelength conversion members R may be provided.

In an embodiment, the wavelength conversion member R may be disposed in or housed by the housing H. In such an embodiment, the housing H may have a shape of a bar extending in the longitudinal direction.

In such an embodiment, a space is defined in the housing H. In such an embodiment, the space inside the housing H is sealed, and exchange of air and moisture with the outside may be blocked. The wavelength conversion member R may fill the internal space defined in the housing H. In such an embodiment, the wavelength conversion member R may be hermetically housed by the housing H. When the wavelength conversion member R is completely sealed or hermetically housed by the housing, the wavelength conversion member R may not be exposed to external air or moisture.

The housing H may include glass. In an embodiment, the housing H may have a form of a glass tube with an empty inside.

In an embodiment, the housing H may include or be made of a same type of material or glass as the light guide plate LG.

In an alternative embodiment, the housing H may include or be made of a type of material or glass different from that of the light guide plate LG.

The housing H may be bonded to the light guide plate LG, while housing the wavelength conversion member R. Herein, the term 'bonded' may mean that the two elements are directly in contact with each other and connected to each other. In addition, the "bonded" may mean that two elements are partially melted and fused.

In an embodiment, the housing H may be directly in contact with the side surface SS of the light guide plate LG. In such an embodiment, the housing H may be bonded to the side surface SS of the light guide plate LG. In such an embodiment, the housing H and the light guide plate LG may be bonded together to form an integral body.

When the housing H and the light guide plate LG are directly in contact with each other, a contact surface CS may be defined between the housing H and the light guide plate LG. In such an embodiment, the contact surface CS may be a region in which the side surface SS of the light guide plate LG and one surface of the housing H are directly in contact with each other. In an embodiment, the contact surface CS may be entirely formed on the side surface of the light guide plate LG or may be partially formed on the side surface SS of the light guide plate LG.

In an embodiment, where the housing H and the light guide plate LG are directly bonded to each other as described above, an occurrence of misalignment between the wavelength conversion member R disposed in the housing H and the light guide plate may be effectively prevented. In such an embodiment, by integrating the housing H and the light guide plate LG, the number of parts included in the module may be decreased. The bonding between the housing H and the light guide plate LG will be described in greater detail with reference to FIGS. 3 through 5.

In an embodiment, as described above, the backlight unit may include the light source L disposed on a side of the light guide plate LG.

The light source L may provide light to the light guide plate LG. In an embodiment, the light source L may be disposed to be adjacent to the side surface SS of the light guide plate LG.

A housing H for housing the wavelength conversion member R may be disposed between the light source L and the light guide plate LG. Thus, the light provided by the light source L may be provided to the light guide plate LG through the wavelength conversion member R.

In an embodiment, the light source L may include a base plate B and a light-emitting diode D. The base plate B may support the light-emitting diode D. In an embodiment, the base plate B may extend in the longitudinal direction. In an embodiment, the base plate B may extend in the same direction as the wavelength conversion member R, i.e., in the y-axis direction of FIG. 1. In an embodiment, the base plate B and the wavelength conversion member R may extend along each other.

The base plate B may include a circuit board (not illustrated) for controlling the light-emitting diode D.

The light-emitting diode D may be disposed on the base plate B. The light-emitting diode D may be a light-emitting diode that emits blue light or a light-emitting diode that emits ultraviolet ("UV") light. However, this is merely exemplary, and the light-emitting diode D is not limited thereto.

A plurality of light-emitting diodes D may be disposed along the base plate B. In such an embodiment, as described above, the light emitted from the light-emitting diode D may travel to the light guide plate LG via the wavelength conversion member R. In such an embodiment, the light having passed through the wavelength conversion member R is converted into white light and may be provided to the light guide plate LG.

Hereinafter, the bonding between the housing H and the light guide plate LG will be described in more detail with reference to FIGS. 3 and 4.

Figure 3:
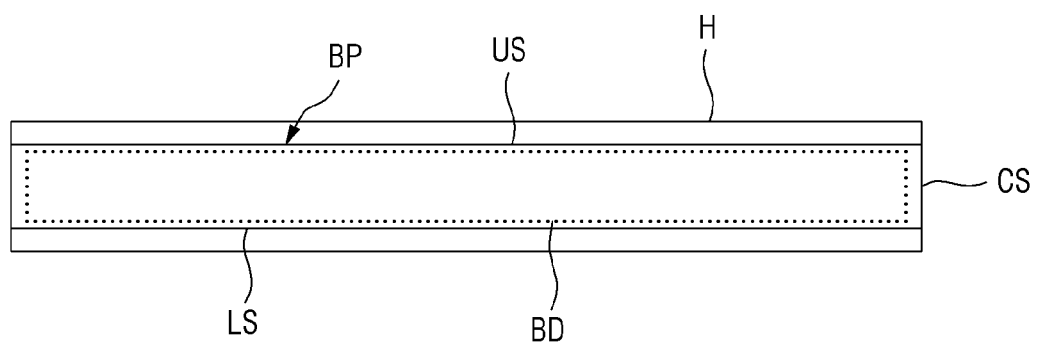
FIG. 3 is a side plan view of a display device according to an embodiment of the invention.

FIG. 3 is a side plan view of a display device according to an embodiment of the invention. FIG. 4 is an enlarged view of encircled portion 'A' of FIG. 2.

FIG. 3 is a view as seen in the direction of a first arrow ① of FIG. 2.

Referring to FIG. 3, a bonding portion BP may be formed on the contact surface CS between the housing H and the light guide plate LG. The bonding portion BP may integrate the housing H and the light guide plate LG into each other.

The bonding point BP may be entirely formed or partially formed on the contact surface CS.

In an embodiment, the bonding portion BP may include a plurality of bonding dots BD. The bonding dots BD may at least partly melt corresponding portions of the housing H and the light guide plate LG with the contact surface CS interposed therebetween to bond the housing H and the light guide plate LG. In an embodiment, the housing H and the light guide plate LG may be fused to each other by the bonding dots BD.

In an embodiment, the bonding dots BD may be arranged intermittently along the contact surface CS. In an embodiment, as illustrated in FIG. 3, the bonding dots BD may be arranged along an outer periphery of the contact surface CS inside the contact surface CS. In an embodiment in which the contact surface CS has a rectangular shape, the plurality of bonding dots BD may collectively have a rectangular shape.

However, the shape of the bonding dots BD is not limited thereto. Alternative, the bonding dots BD may also be disposed along a single straight line inside the contact surface CS.

FIG. 3 illustrates an embodiment where the bonding dots BD are arranged intermittently, but the invention is not limited thereto. In an alternative embodiment, the bonding dots BP may be arranged continuously. In such an embodiment, where the bonding dots BD are continuously arranged, the plurality of bonding dots BD are connected to each other. In such an embodiment, the bonding portion BP may include at least one bonding line formed by the plurality of bonding dots BD.

Figure 4:
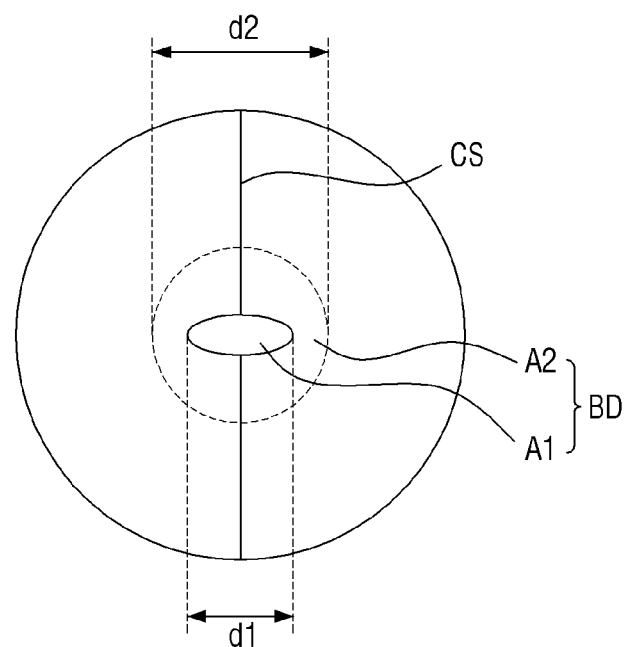
FIG. 4 is an enlarged view of the encircled portion 'A' in FIG. 2.

FIG. 4 illustrates a single bonding dot BD in the circled portion 'A', for convenience of illustration.

In an embodiment, a bonding dot BD may include a central region A1 and a peripheral region A2 located outside the central region A1.

In an embodiment, the shape of the bonding dots BD may be determined by a bonding method using laser. Details of the bonding method using the laser will be described later.

The central region A1 of the bonding dot BD may be formed across the contact surface CS. In an embodiment, the cross section of the central region A1 may have an elliptical shape in which a major axis is longer than a minor axis.

Hereinafter, an embodiment where the central region A1 has an elliptical cross section will be described, but the shape of the cross section of the central region is not limited thereto. In an alternative embodiment, the cross section of the central region A1 may also have a circular shape, and in such an embodiment, as it will be described later, the description of the major axis may be replaced with a description of a diameter of circle.

FIG. 4 illustrates an embodiment where the major axis of the central region A1 is arranged to be perpendicular to the contact surface CS, but the direction of the major axis is not limited thereto. In such an embodiment, the direction of the major axis may vary, depending on the laser irradiation direction.

In the central region A1, a boundary between the housing H and the light guide plate LG may be shown. That is, the contact surface CS between the housing H and the light guide plate LG in the central region A1 may not be clearly distinguished. That is, in the embodiment in which the housing H is made of a first material and the light guide plate LG is made of a second material, the central region A1 may be a region in which the first material and the second material are mixed with each other with no boundary.

In an embodiment in which the housing H and the light guide plate LG are made of the same type of glass, the central region A1 of the bonding dot BD may be a region in which the housing part H and the light guide plate LG are mixed with each other with no boundary.

In an alternative embodiment in which the housing H and the light guide plate LG are made of different types of glass, the central region A1 may be a region in which different kinds of glasses are mixed with each other with no boundary.

In an embodiment, the width of the major axis of the central region A1 may be in a range of about 10 micrometers (μm) to about 20 μm.

A peripheral region A2 may be disposed outside the central region A1 to surround the central region A1. In an embodiment, the cross-sectional shape of the central region A1 may be circular.

The housing H and the light guide plate LG included in the peripheral region A2 may be connected to each other by being at least partially melted. However, in such an embodiment, the boundary between the housing H and the light guide plate LG is maintained, and the contact surface CS may also be clearly identified.

In an embodiment, the width of the peripheral area A2 may be in a range of about 70 μm to about 100 μm.

When the size of the bonding dot BD is large, thermal damage of the wavelength conversion member R housed in the housing H may occur. In an embodiment, as described above, the maximum width of the bonding dots BD is about 100 μm or about 70 μm, the thermal damage to the wavelength conversion member R may be effectively prevented or substantially minimized.

In an embodiment, laser with femtosecond wavelength may be used to minimize the size of the bonding dot BD. in such an embodiment, when bonding the housing H and the light guide plate LG using the femtosecond laser, the maximum width of the bonding dots BD may be maintained to about 100 μm or less, to minimize damage to the wavelength conversion member R caused by heat.

Next, an alternative embodiment of a backlight unit according to the invention will be described.

In the following embodiments, the same configurations as those described are denoted by the same reference numerals, and any repetitive detailed descriptions thereof will be omitted or simplified.

Figure 5:
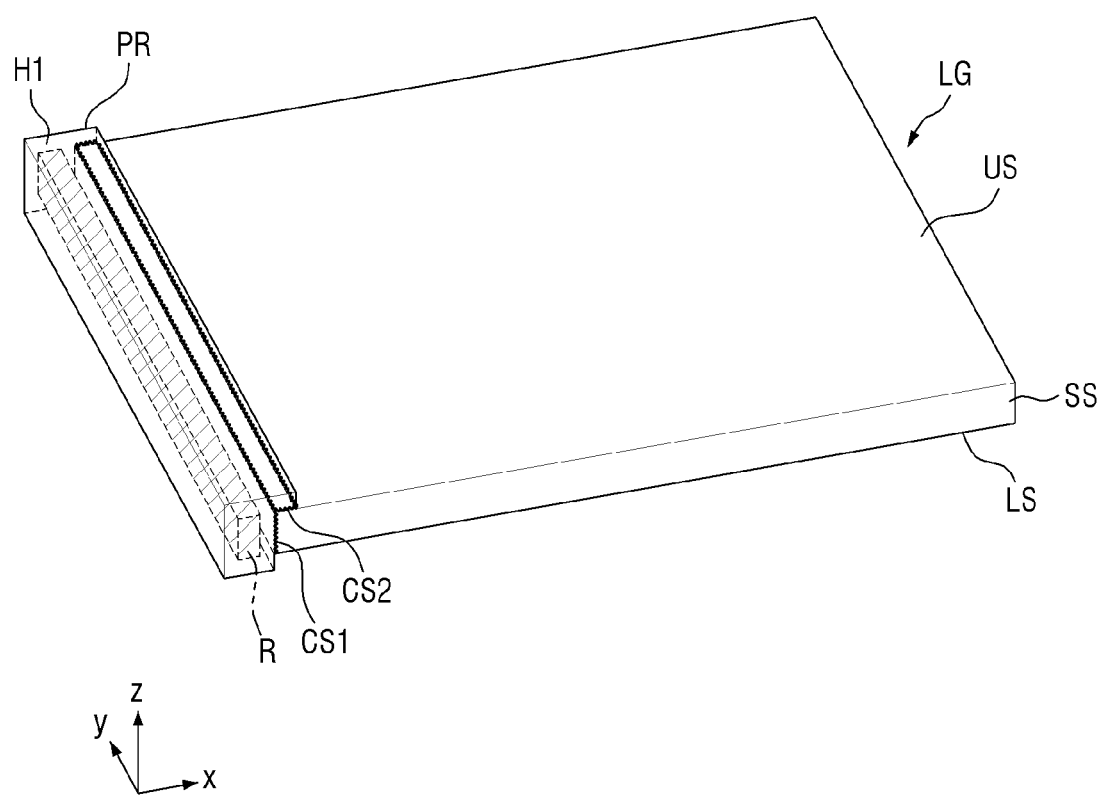
FIG. 5 is a perspective view of a backlight unit according to an alternative embodiment of the invention.
Figure 6:
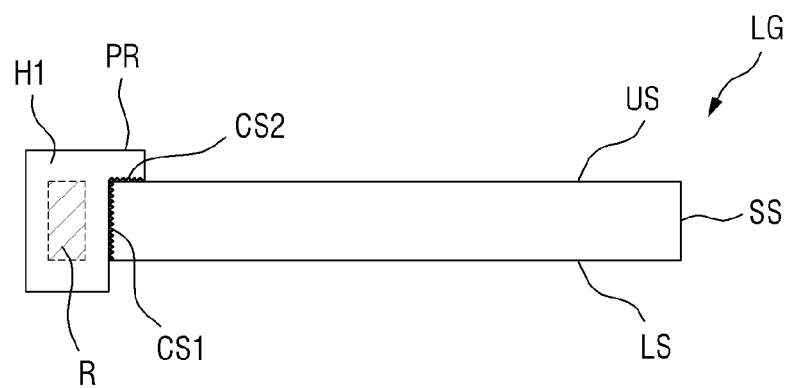
FIG. 6 is a side view of the embodiment of FIG. 5.

FIG. 5 is a perspective view of a backlight unit according to an alternative embodiment of the invention. FIG. 6 is a side view of the embodiment of FIG. 5.

Referring to FIGS. 5 and 6, such an embodiment of the backlight unit is substantially the same as the embodiments of the backlight unit described above with reference to FIG. 1 except that a protrusion PR is defined on a side surface of the housing H1.

In an embodiment, the protrusion PR may be defined or formed on a side surface of the housing H1. The protrusion PR may protrude from the housing H1 toward the light guide plate LG.

In an embodiment, the protrusion PR may be integrally formed with the housing H1. In such an embodiment in which the housing H1 is formed of glass, the protrusion PR is formed of glass such as the housing H1 and may be transparent.

In such an embodiment, the protrusion PR and the housing H1 may have an overall 'L' shape.

In such an embodiment, where the backlight unit includes the protrusion PR, a first contact surface CS1 is formed between the housing H1 and the light guide plate LG, and a second contact surface CS2 may be formed between the protrusion PR and the light guide plate LG. The first contact surface CS1 may be formed on the side surface SS of the light guide plate LG as described above with reference to FIG. 1 or the like. That is, the first contact surface CS1 may be substantially the same as the contact surface CS described above with reference to FIG. 1 or the like.

The second contact surface CS2 may be formed on the upper surface US of the light guide plate LG. In such an embodiment, the second contact surface CS2 may be formed between the light guide plate LG and the protrusion PR. In such an embodiment, the upper surface of the light guide plate LG and the lower surface the protrusion PR may come into with each other to form the second contact surface CS2.

In such an embodiment as described above, when the first contact surface CS1 and the second contact surface CS2 are formed, the bonding between the housing H1 and the light guide plate LG may be further strengthened.

In such an embodiment, since the protrusion PR and one surface of the housing H1 accurately support the light guide plate LG, the housing H1 may be accurately aligned, more specifically, the wavelength conversion member R and the light guide plate LG may be accurately aligned with each other.

Figure 7:
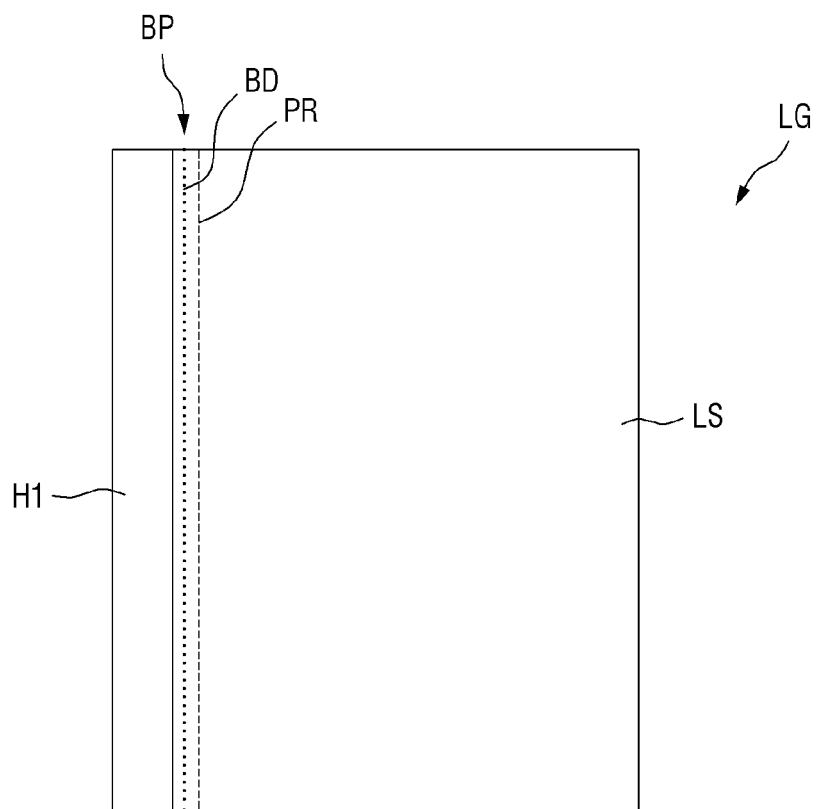
FIG. 7 is a partial plan view of a backlight unit according to an embodiment of the invention.

FIG. 7 is a partial plan view of a backlight unit according to an embodiment of the invention. FIG. 7 is a view which is seen from the bottom of the light guide plate LG toward the positive direction of the z-axis.

A bonding portion BP may be formed on the second contact surface CS2 formed by contact of the protrusion PR and the upper surface of the light guide plate LG.

The bonding portion BP may include a plurality of bonding dots BD. In such an embodiment, each bonding dot BD may be substantially the same as that described above with reference to FIGS. 3 and 4.

A plurality of bonding dots BD may be arranged intermittently along the y-axis direction. In an embodiment, a plurality of bond dots BD may be arranged along the longitudinal direction of the protrusion PR. Here, the longitudinal direction of the protrusion PR may be the y-axis direction. (The protruding direction of the protrusion PR may be defined as the x-axis direction).

In an alternative embodiment, the plurality of bonding dots BD may be connected to each other and continuously arranged. In such an embodiment, a plurality of bonding dots BD may collectively define a bonding line.

In an embodiment, the plurality of bonding dots BD may be disposed along the outer periphery of the second contact surface CS inside the second contact surface CS2. In an embodiment in which the second contact surface CS2 has a rectangular shape, the plurality of bonding dots BD may be arranged along the side of the second contact surface CS2 having the rectangular shape.

Figure 8:
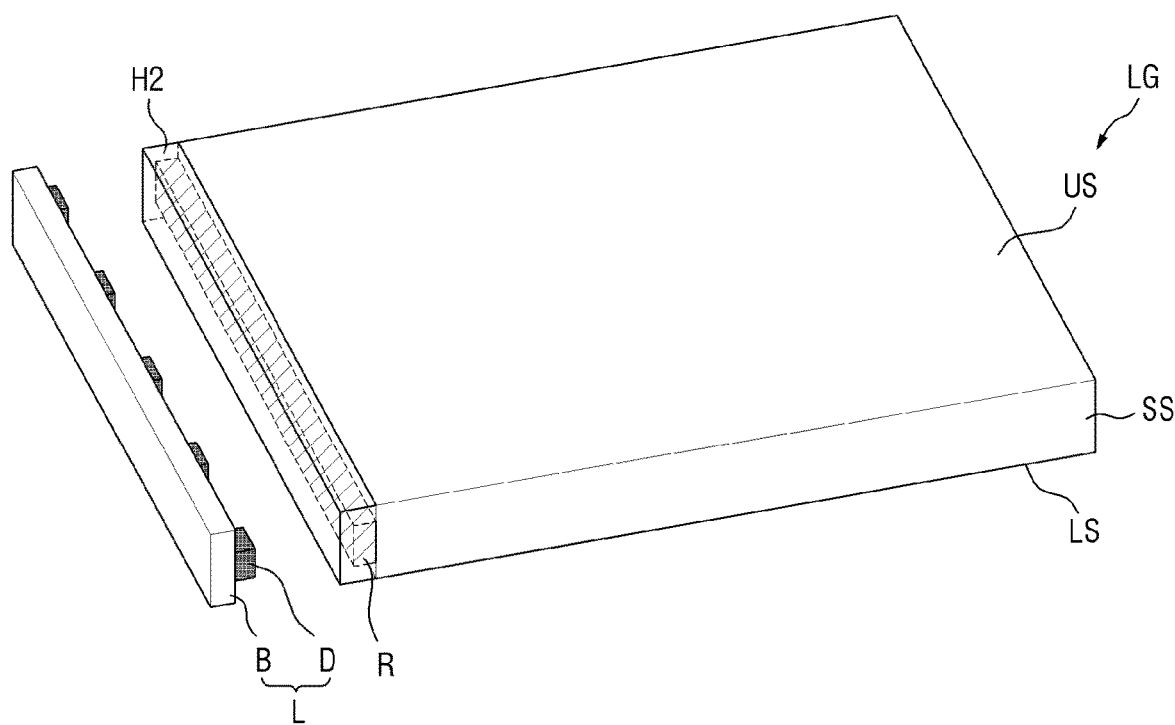
FIG. 8 is a perspective view of a backlight unit according to another alternative embodiment of the invention.
Figure 9:
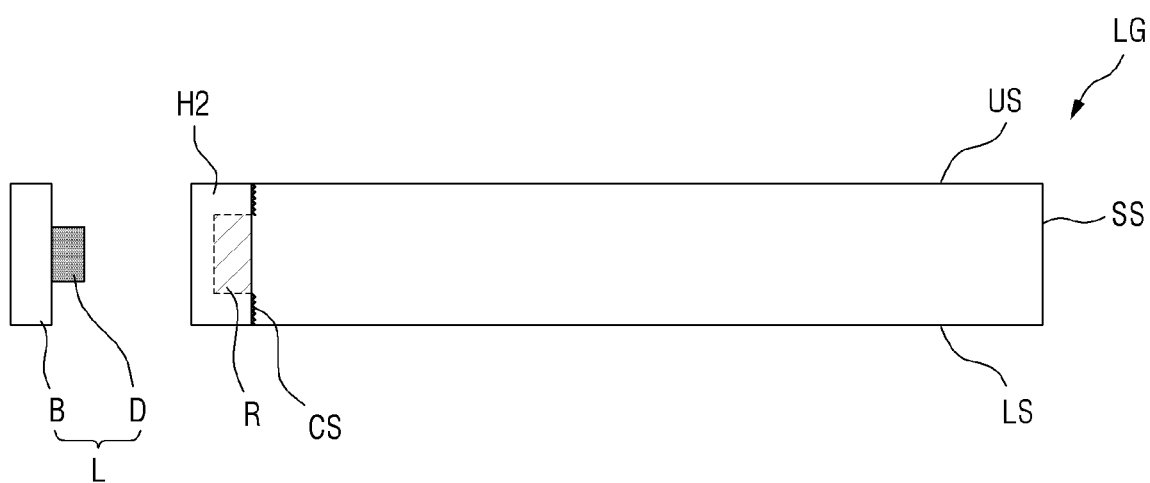
FIG. 9 is a side view of the backlight unit according to the embodiment of FIG. 8.

FIG. 8 is a perspective view of a backlight unit according to another alternative embodiment of the invention. FIG. 9 is a side view of the backlight unit according to the embodiment of FIG. 8.

Referring to FIGS. 8 and 9, such an embodiment of the backlight unit is substantially the same as the embodiments of the backlight unit described above with reference to FIG. 1 except that the wavelength conversion member R is directly in contact with the light guide plate LG.

In an embodiment, the wavelength conversion member R may be directly in contact with the side surface SS of the light guide plate LG. In such an embodiment, a side surface of the wavelength conversion member R and the side surface of the light guide plate LG may extend in the same direction and may be in direct contact with each other.

In such an embodiment, the housing H2 may be arranged to wrap around the wavelength conversion member R. In such an embodiment, the wavelength conversion member R may be sealed by the housing H2 and the side surface of the light guide plate LG.

In such an embodiment, a bonding portion BP may be formed on the contact surface CS between the housing H2 and the light guide plate LG to seal the wavelength conversion member R, as described above with reference to FIG. 3.

In such an embodiment, the side surface SS of the light guide plate LG is in contact with the wavelength conversion member R, and the side surface SS and the housing H2 may come into contact with each other in the remaining regions except the portion in contact with the wavelength conversion member R on the side surface SS to form the contact surface CS. In such an embodiment, the contact surface CS between the light guide plate LG and the housing H2 may be formed along the outer periphery of the wavelength conversion member R.

Figure 10:
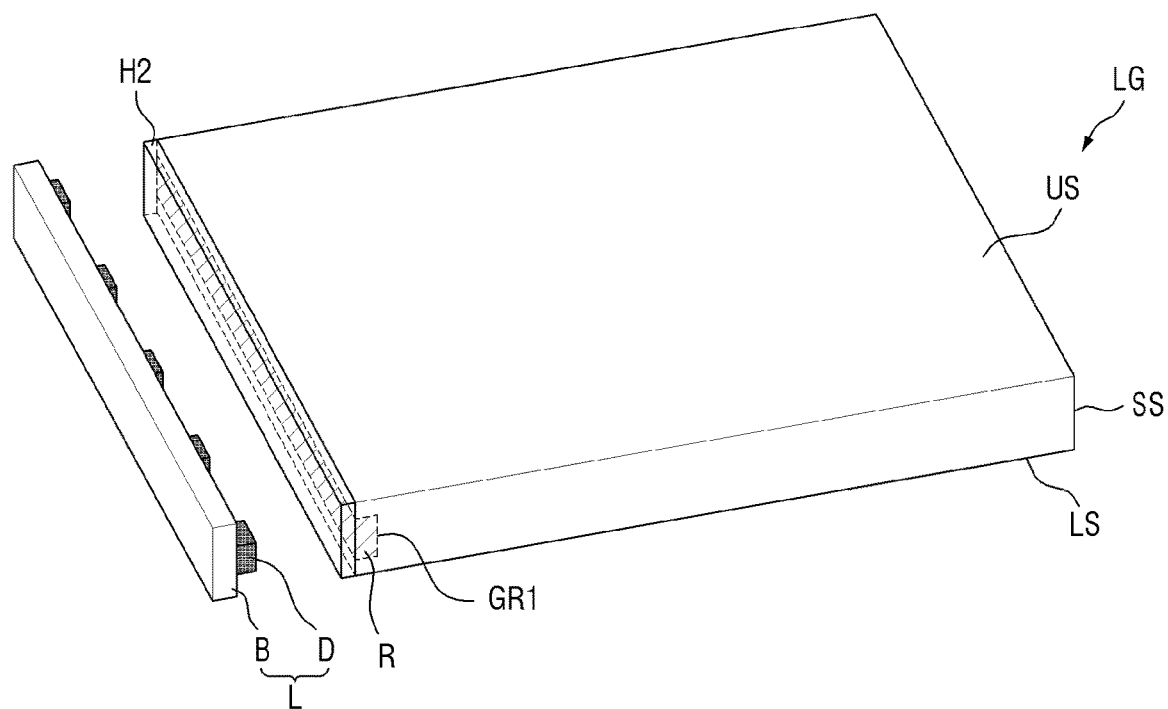
FIG. 10 is a perspective view of a backlight unit according to another alternative embodiment of the invention.
Figure 11:
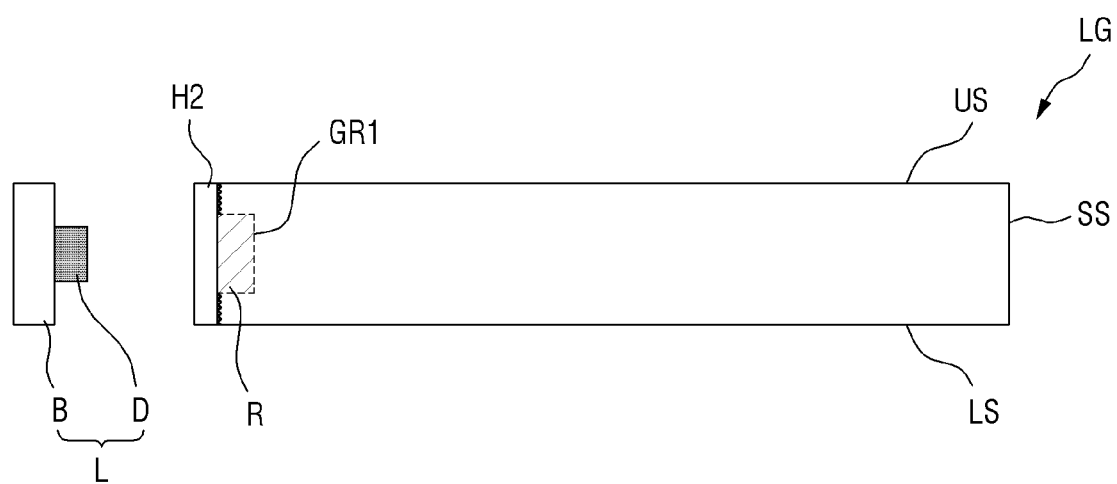
FIG. 11 is a side view of the backlight unit according to the embodiment of FIG. 10.

FIG. 10 is a perspective view of a backlight unit according to another alternative embodiment of the invention. FIG. 11 is a side view of the backlight unit according to the embodiment of FIG. 10.

Referring to FIGS. 10 and 11, such an embodiment of the backlight unit is substantially the same as the embodiments of the backlight unit described above with reference to FIG. 8 except that a groove GR1 recessed inward from the side surface SS is formed in the light guide plate LG.

In an embodiment, the light guide plate LG may have a groove recessed inward from the side surface SS (hereinafter, a first groove GR1). The first groove GR1 may extend along the longitudinal direction of the side surface SS of the light guide plate LG. In an embodiment, the first groove GR1 may continuously extend. FIG. 10 illustrates an embodiment where the first groove GR1 continuously extends, but the invention is not limited thereto. In another alternative embodiment, a plurality of the first grooves GR may intermittently extend.

The wavelength conversion member R may be disposed or filled in a space defined by the first groove GR1. In an embodiment, the thickness of the wavelength conversion member R and the height of the first groove GR1 may be substantially the same as each other. Therefore, the side surface SS of the light guide plate LG and the outer surface of the wavelength conversion member R may be arranged on a same plane.

The housing H2 may be arranged to cover the side surface SS and the wavelength conversion member R. In such an embodiment, the central part of the housing H2 may be in contact with the wavelength conversion member R and the peripheral part may be in contact with the side surface SS to form the contact surface CS. The contact surface CS may be substantially the same as that in the backlight unit described above.

The wavelength conversion member R may be completely sealed by the housing H2 and the side surface SS of the light guide plate LG.

Figure 12:
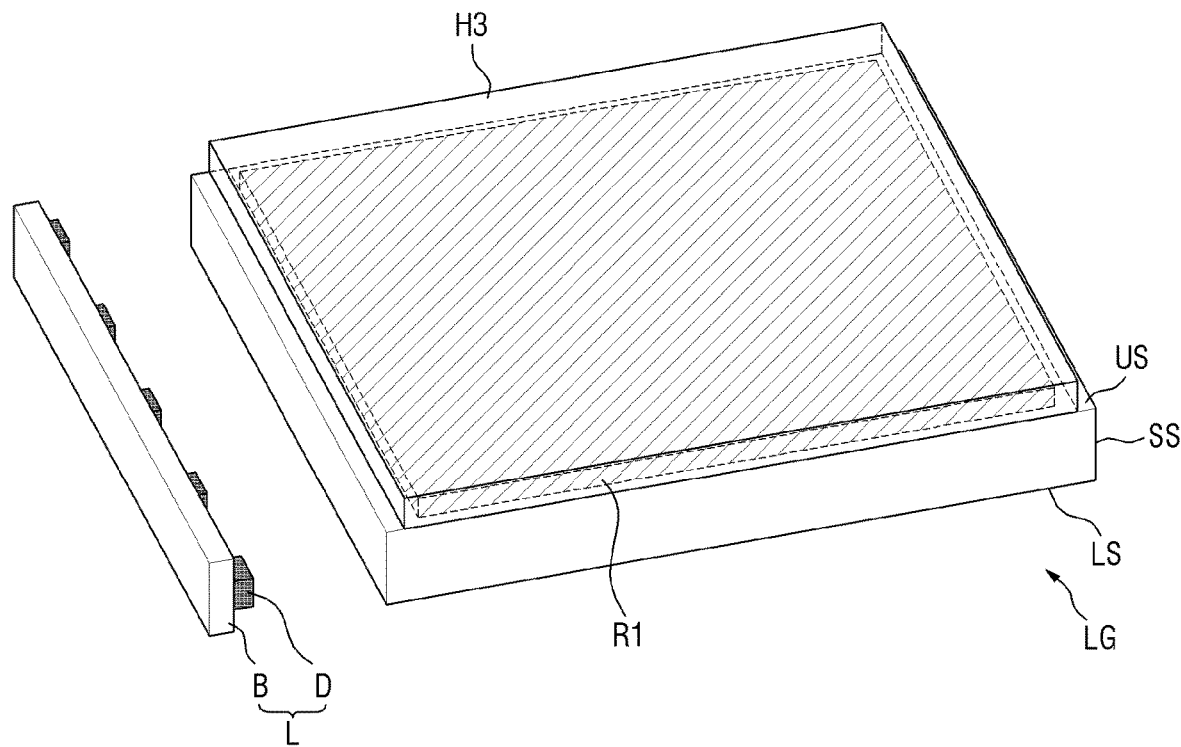
FIG. 12 is a perspective view of a backlight unit according to another alternative embodiment of the invention.
Figure 13:
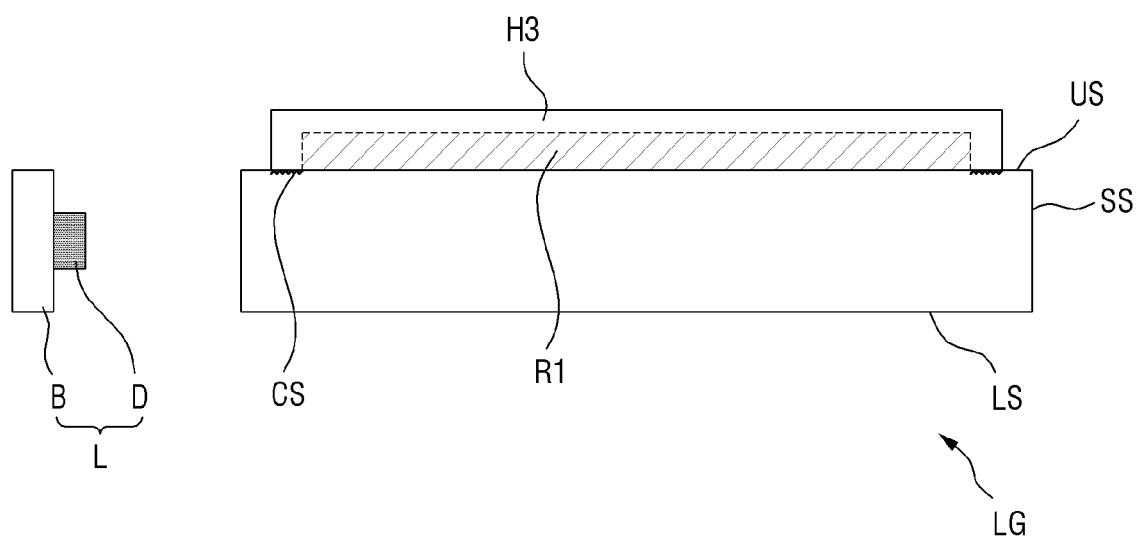
FIG. 13 is a side view of the backlight unit according to the embodiment of FIG. 12.

FIG. 12 is a perspective view of a backlight unit according to another alternative embodiment of the invention. FIG. 13 is a side view of the backlight unit according to the embodiment of FIG. 12.

Referring to FIGS. 12 and 13, such an embodiment of a backlight unit is substantially the same as the embodiments of the backlight unit described above with reference to FIG. 1 except that the wavelength conversion member R1 is disposed on the upper surface US of the light guide plate LG.

In such an embodiment, the wavelength conversion member R1 may be arranged on the upper surface US of the light guide plate LG. In such an embodiment, the light provided by the light source L is guided to the upper surface US by the light guide plate LG, and the wavelength of light having passed through the wavelength conversion member R1 may be converted into white light.

In an embodiment, the wavelength conversion member R1 may be disposed entirely on the upper surface US of the light guide plate LG. However, the invention is not limited thereto. In an alternative embodiment, the wavelength conversion member R1 may be partially disposed on the upper surface US of the light guide plate LG.

In such an embodiment, the wavelength conversion member R1 and the light guide plate LG may be directly in contact with each other.

The housing H3 may be arranged on the wavelength conversion member R1.

In an embodiment, the central part of the housing H3 may be in contact with the wavelength conversion member R1 and the peripheral part may be in contact with the upper surface US of the light guide plate LG to form the contact surface CS. In such an embodiment, the contact surface CS may be arranged along the outer periphery of the wavelength conversion member R1.

The wavelength conversion member R1 may be completely sealed by the upper surface US of the light guide plate LG and the housing H3.

A bonding portion may be formed on the contact surface CS, which is substantially the same as that in the backlight unit described above.

Figure 14:
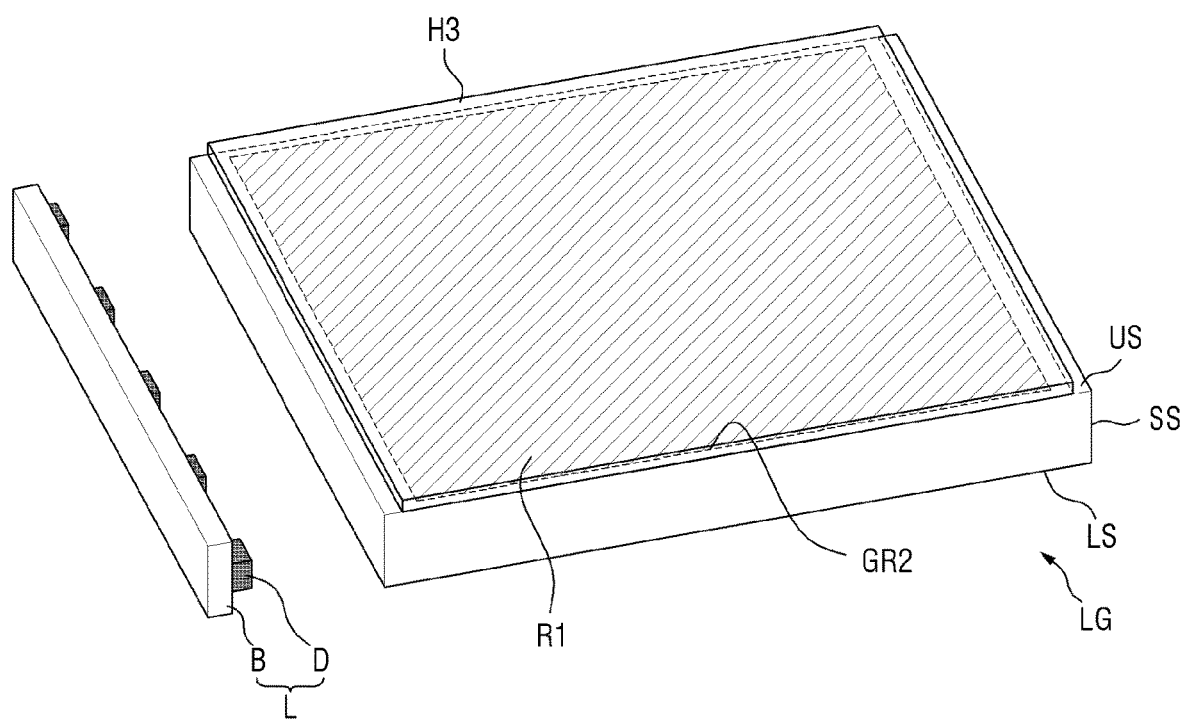
FIG. 14 is a perspective view of a backlight unit according to another alternative embodiment of the invention.
Figure 15:
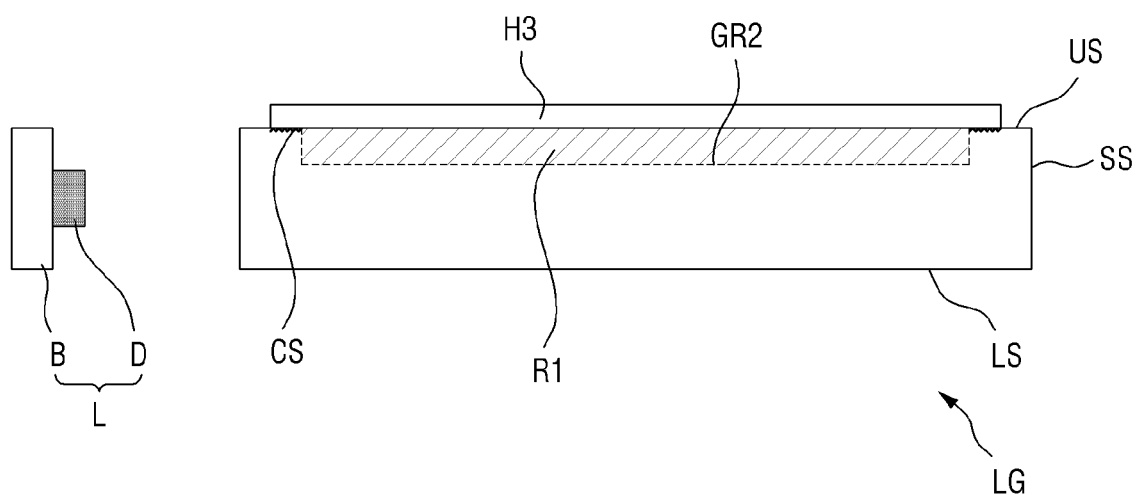
FIG. 15 is a side view of the backlight unit according to the embodiment of FIG. 14.

FIG. 14 is a perspective view of a backlight unit according to another alternative embodiment of the invention. FIG. 15 is a side view of the backlight unit according to the embodiment of FIG. 14.

Referring to FIGS. 14 and 15, such an embodiment of a backlight unit is substantially the same as the embodiments of the backlight unit described above with reference to FIG. 12 except that a groove recessed inward from the upper surface US of the light guide plate LG is formed.

In an embodiment, the light guide plate LG may have a groove recessed inward from the upper surface US (hereinafter, a second groove GR2). The planar shape of the second groove GR1 may be a square shape.

In an embodiment, the outer periphery of the first eagle portion GR1 may be disposed inside the outer periphery of the upper surface of the light guide plate LG.

The wavelength conversion member R1 may be disposed or filled in the internal space in which the second groove GR2 is formed.

In an embodiment, the thickness of the wavelength conversion member R1 and the height of the second groove GR2 may be substantially the same as each other. Therefore, the upper surface US of the light guide plate LG and the upper surface of the wavelength conversion member R1 may be arranged on the same plane.

A housing H3 may be arranged to cover the upper surface US and the wavelength conversion member R1.

In an embodiment, the central part of the housing H3 may be in contact with the wavelength conversion member R1, and the peripheral part may be in contact with the upper side US to form a contact surface CS. The contact surface CS may be substantially the same as that in the backlight unit described above.

The wavelength conversion member R1 may be completely sealed by the housing H3 and the upper surface of the light guide plate LG.

Figure 16:
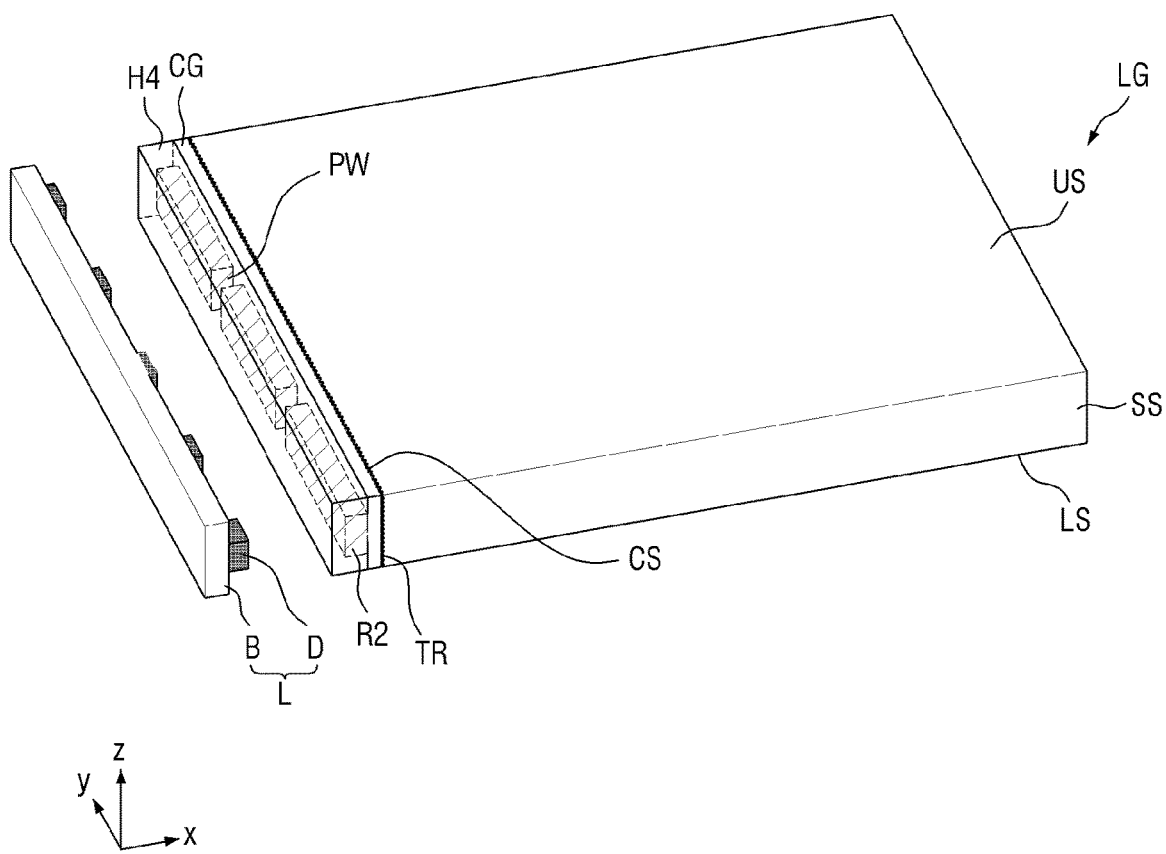
FIG. 16 is a perspective view of a backlight unit according to another alternative embodiment of the invention.
Figure 17:
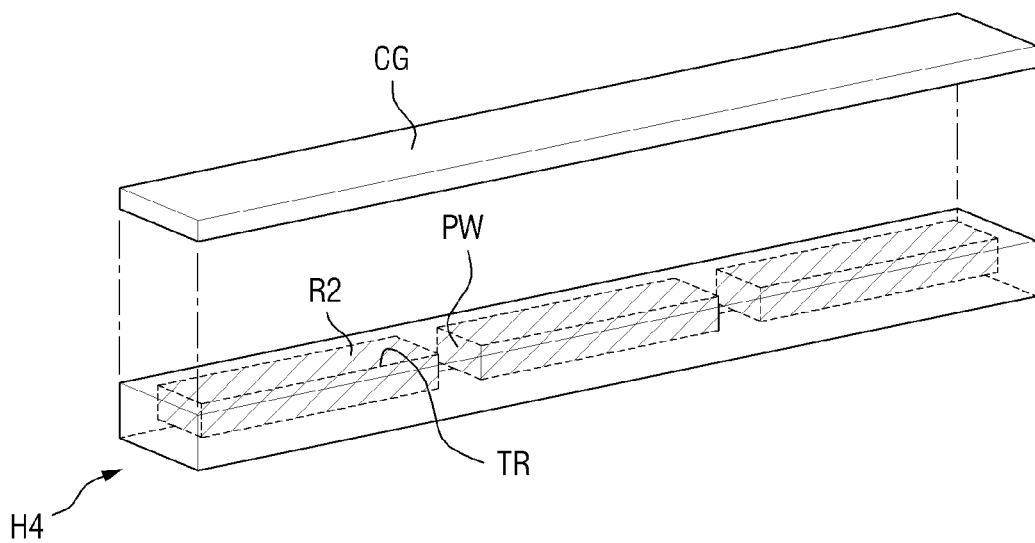
FIG. 17 is a partial perspective view of the embodiment of FIG. 16.
Figure 18:
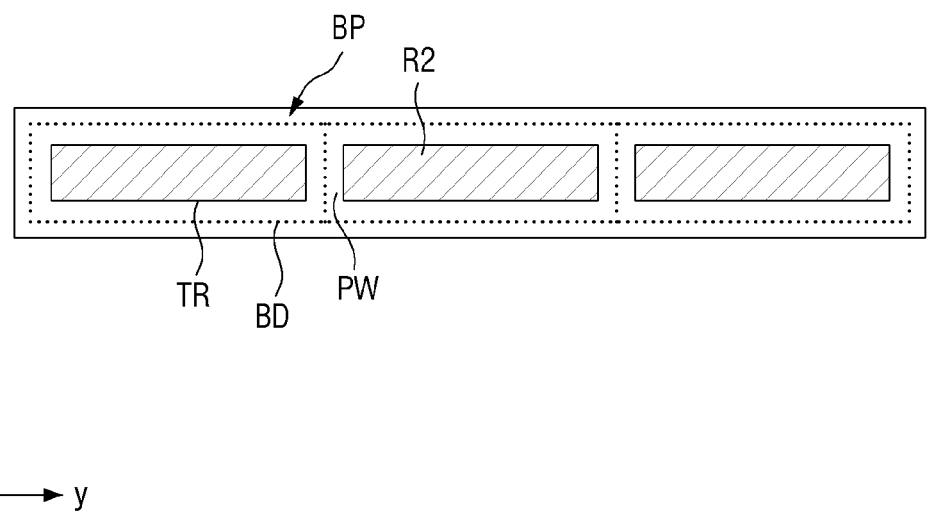
FIG. 18 is a plan view of the embodiment of FIG. 17.
Figure 19:
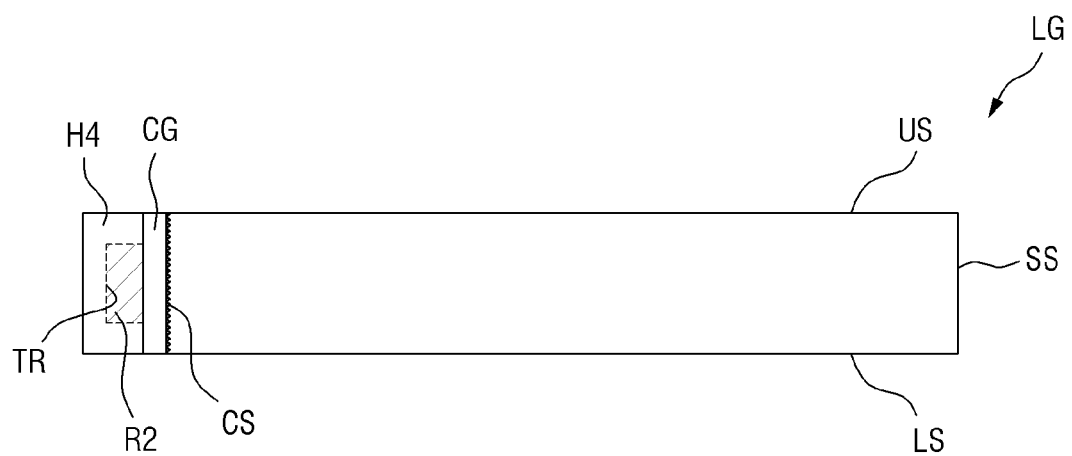
FIG. 19 is a side view of the backlight unit according to the embodiment of FIG. 16.

FIG. 16 is a perspective view of a backlight unit according to another alternative embodiment of the invention. FIG. 17 is a partial perspective view of the embodiment of FIG. 16. FIG. 18 is a plan view of the embodiment of FIG. 17. FIG. 19 is a side view of the backlight unit according to the embodiment of FIG. 16.

Referring to FIGS. 16 to 19, such an embodiment of a backlight unit is substantially the same as the embodiments of the backlight unit described above with reference to FIG. 1 except that a trench TR is defined or formed in the housing H4.

In an embodiment, a plurality of trenches TR may be defined or formed in the housing H4. The plurality of trenches TR may be partitioned by a plurality of partitions PW. The wavelength conversion member R2 may be disposed or filled in a space defined by the trench TR. FIGS. 17 and 18 illustrate an embodiment where three wavelength conversion members R2 are filled in three trenches TR, respectively, but this is merely exemplary, and the number of trenches TR and the number of wavelength conversion members R2 are not limited thereto.

In an embodiment, the housing H4 may further include a cover glass CG disposed on the trenches TR and the wavelength conversion members R2. The cover glass CG may be bonded in contact with the trenches TR and the wavelength conversion members R2. In such an embodiment, the wavelength conversion members R2 may be completely sealed by the cover glass CG (see FIG. 17).

In an embodiment, the light guide plate LG may come into contact the cover glass CG. In such an embodiment, the side surface SS of the light guide plate LG and the cover glass CG may come into contact with each other to form the contact surface CS.

In such an embodiment, the wavelength conversion member R2 does not come into direct contact with the light guide plate LG.

When the partition wall PW is defined in the housing H4, the bonding portion BP may be formed to overlap a partition wall PW (see FIG. 18).

The wavelength conversion member R2 may be vulnerable to heat, and when heat is applied to the wavelength conversion member R2, quantum dots disposed therein may be destroyed. In such an embodiment, as illustrated in FIG. 18, when the bonding portion BP is formed to wrap around the wavelength conversion member R2, that is, the bonding portion BP is formed to partially overlap the partition wall PW, the adhesive strength between the light guide plate LG and the housing H4 may be improved by increasing the area of the bonding point BP, while avoiding damage to the wavelength conversion member R2.

Figure 20:
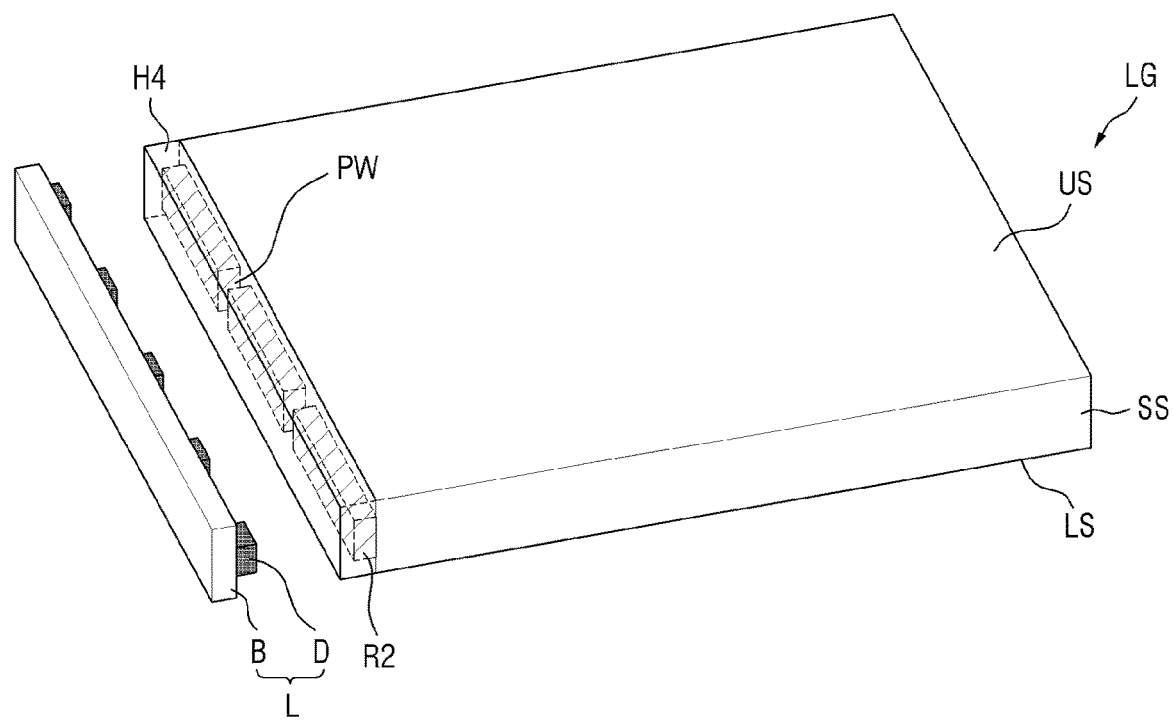
FIG. 20 is a perspective view of a backlight unit according to another alternative embodiment of the invention.
Figure 21:
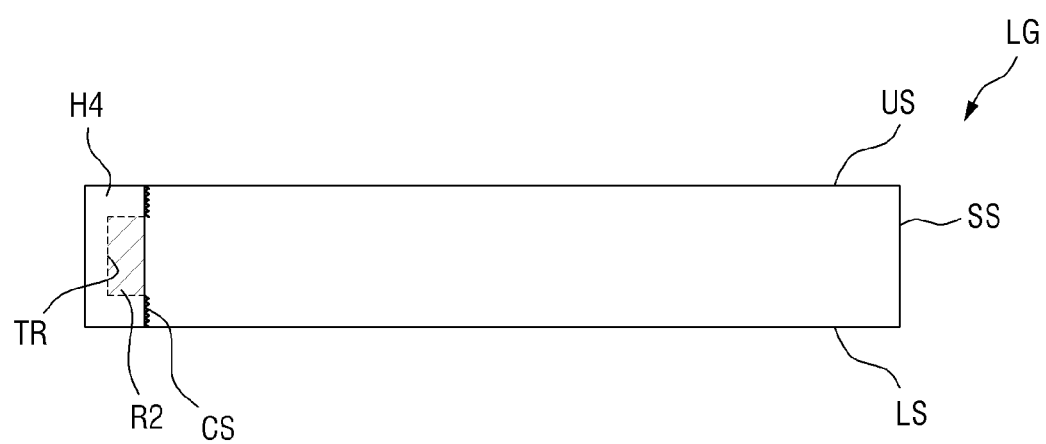
FIG. 21 is a side view of the backlight unit according to the embodiment of FIG. 20.

FIG. 20 is a perspective view of a backlight unit according to another embodiment of the invention. FIG. 21 is a side view of the backlight unit according to the embodiment of FIG. 20.

Referring to FIGS. 20 and 21, such an embodiment of the backlight unit is substantially the same as the embodiments of the backlight unit described above with reference to FIG. 16 except that the wavelength conversion member R2 is directly in contact with the light guide plate LG.

In an embodiment, the wavelength conversion member R2 may be directly in contact with the side surface SS of the light guide plate LG.

In such an embodiment, the housing H4 may be arranged to wrap around the wavelength conversion member R2. In such an embodiment, the wavelength conversion member R2 may be sealed by the housing H2 and the side surface SS of the light guide plate LG.

In such an embodiment, the side surface SS of the light guide plate LG may be in contact with the wavelength conversion member R2, and the housing H2 and the partition wall PW may be in contact with the remaining portions of the side surface SS, except for the portion thereof in contact with the wavelength conversion member R2, to form the contact surface CS.

Figure 22:
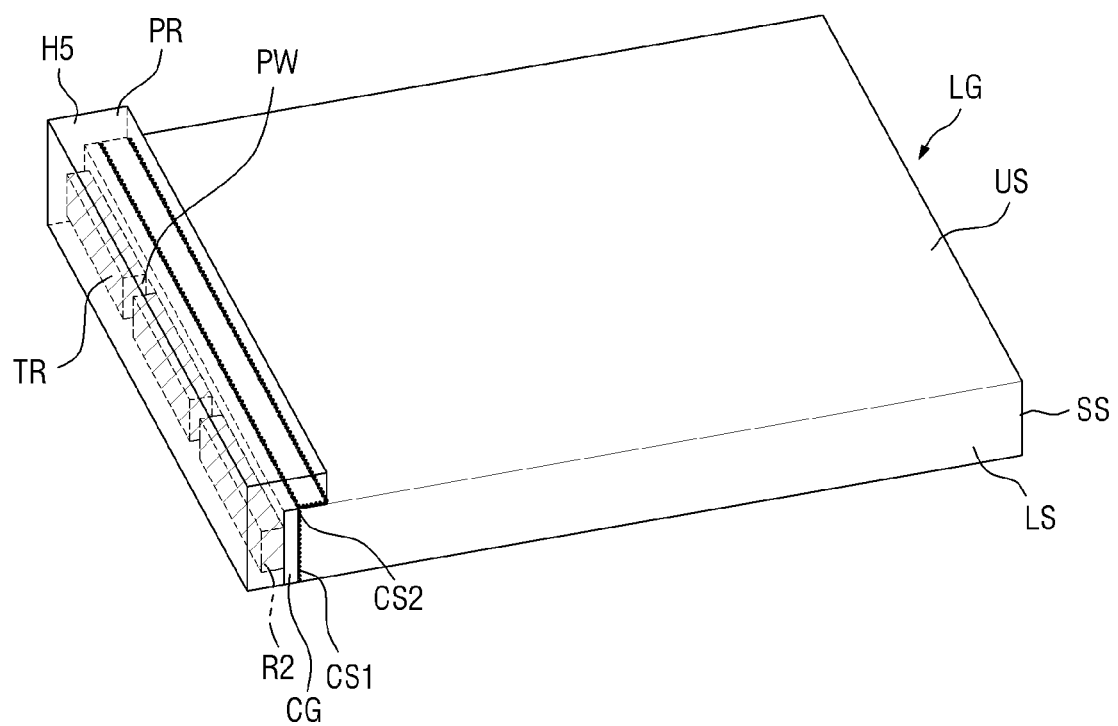
FIG. 22 is a perspective view of a backlight unit according to another alternative embodiment of the invention.
Figure 23:
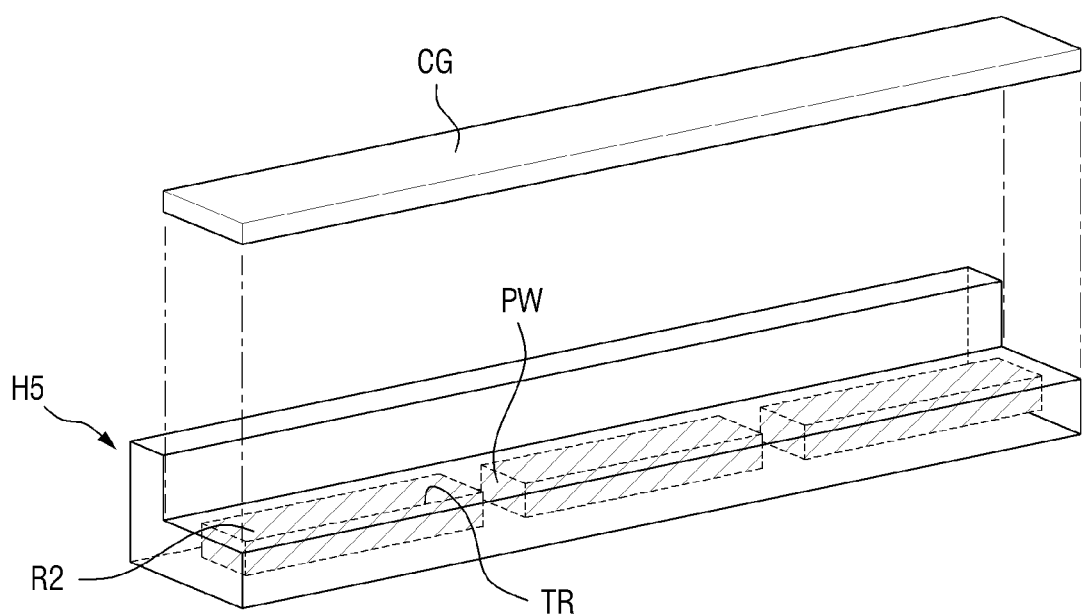
FIG. 23 is a partial perspective view of the backlight unit according to the embodiment of FIG. 22.
Figure 24:
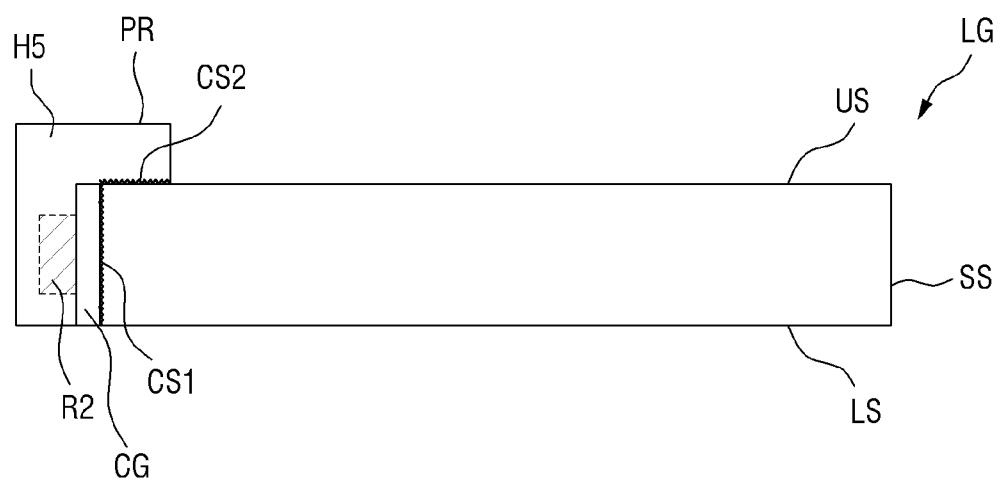
FIG. 24 is a side view of the backlight unit according to the embodiment of FIG. 22.

FIG. 22 is a perspective view of a backlight unit according to another alternative embodiment of the invention. FIG. 23 is a partial perspective view of the backlight unit according to the embodiment in FIG. 22. FIG. 24 is a side view of the backlight unit according to the embodiment of FIG. 22.

Referring to FIGS. 22 to 24, such an embodiment of a backlight unit a is substantially the same as the embodiments of the backlight unit described above with reference to FIG. 1 except that a protrusion PR is defined on a side of a housing H5, and a trench TR is defined in the housing H5.

The protrusion PR may be substantially the same as that described above with reference to FIG. 5. Therefore, any repetitive detailed description thereof will be omitted. In such an embodiment, the protrusion PR may come into contact with the upper surface US of the light guide plate LG to form the second contact surface CS2.

In an embodiment, a plurality of trenches TR may be defined or formed in the housing H5. The plurality of trenches TR may be partitioned by a plurality of partitions PW. The wavelength conversion member R2 may be filled in the space defined by the trench TR. FIG. 23 illustrates an embodiment where three wavelength conversion members R2 are filled in three trenches TR, respectively, but this is merely exemplary, and the number of the trenches TR and the number of wavelength conversion members R2 are not limited thereto.

In an embodiment, as shown in FIG. 23, the housing H5 may further include a cover glass CG disposed on the trench TR and the wavelength conversion member R2. The cover glass CG may be bonded in contact with the trench TR and the wavelength conversion member R2. In such an embodiment, the wavelength conversion member R2 may be completely sealed by the cover glass CG (see FIG. 23).

In an embodiment, the light guide plate LG may come into contact with the cover glass CG. In such an embodiment, the side surface SS of the light guide plate LG and the cover glass CG may come into contact with each other to form the first contact surface CS1 (see FIG. 24).

In such an embodiment, the wavelength conversion member R2 does not come into direct contact with the light guide plate LG.

In an embodiment where the partition wall PW is defined in the housing H5, the bonding portion BP formed on the first contact surface CS1 may be formed to overlap the partition wall PW.

Figure 25:
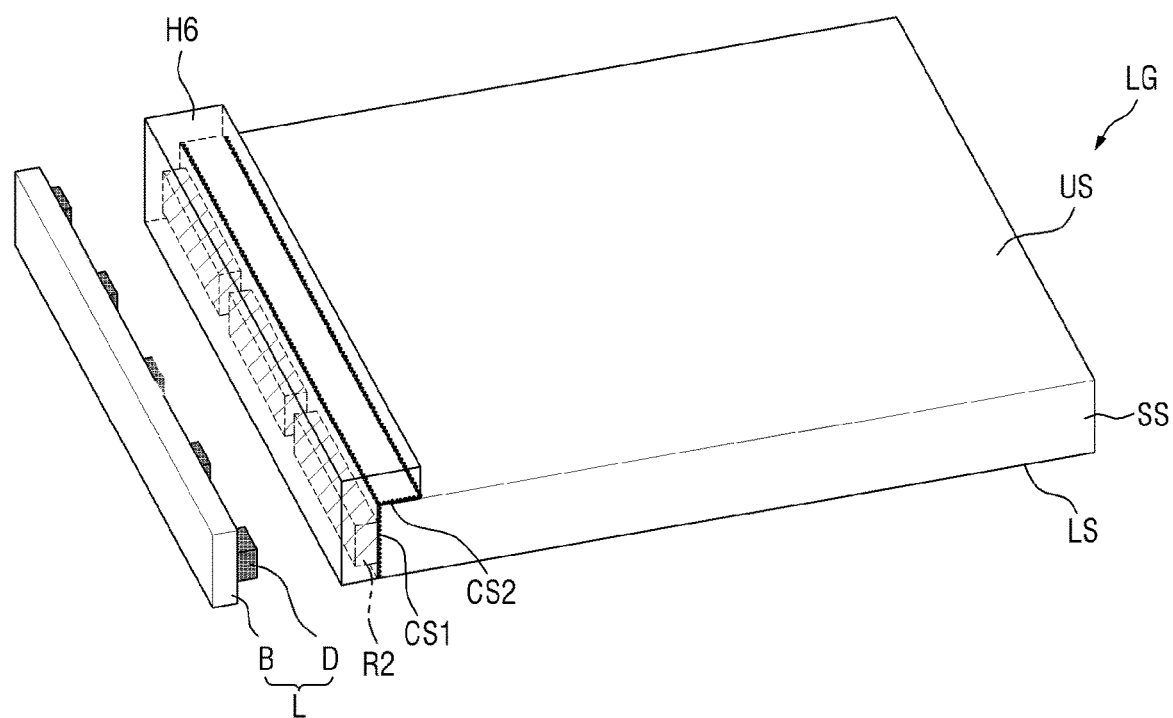
FIG. 25 is a perspective view of a backlight unit according to another alternative embodiment of the invention.

FIG. 25 is a perspective view of a backlight unit according to another alternative embodiment of the invention.

Referring to FIG. 25, such an embodiment of the backlight unit is substantially the same as the embodiments of the backlight unit described above with reference to FIG. 22 except that the wavelength conversion member R2 is directly in contact with the light guide plate LG.

In an embodiment, the wavelength conversion member R2 may come into direct contact with the side surface SS of the light guide plate LG.

In such an embodiment, the housing H6 may be arranged to wrap around the wavelength conversion member R2.

In such an embodiment, the wavelength conversion member R2 may be sealed by the housing H6 and the side surface SS of the light guide plate LG.

In such an embodiment, the side surface SS of the light guide plate LG may come into contact with the wavelength conversion member R2, and, the housing H6 and the partition wall PW may come into contact with the remaining portion of the side surface SS except for the portions thereof directly in contact with the wavelength conversion member R2, to form the first contact surface CS1.

Hereinafter, a display device according to an embodiment of the invention will be described in detail.

Figure 26:
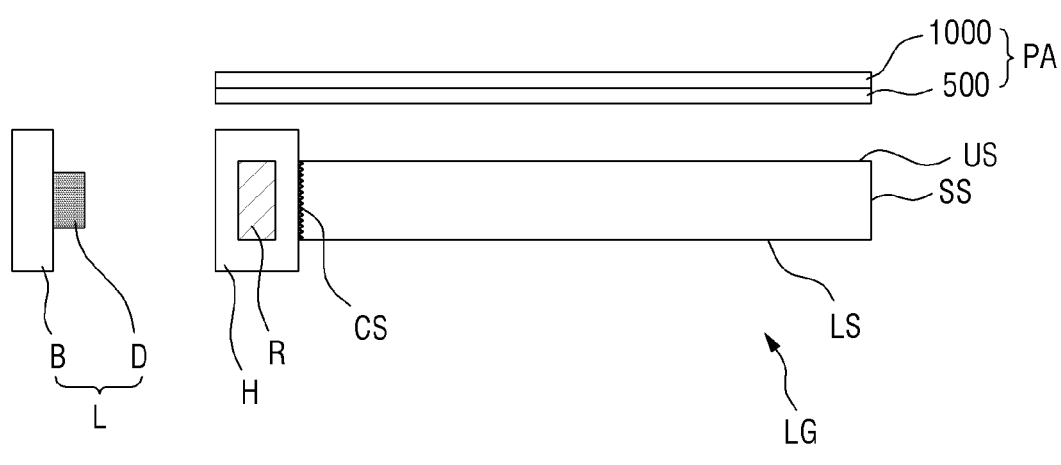
FIG. 26 is a cross-sectional view of a display device according to an embodiment of the invention.

FIG. 26 is a cross-sectional view of a display device according to an embodiment of the invention.

Referring to FIG. 26, an embodiment of a display device includes a backlight unit, and a display panel disposed on the backlight unit.

The backlight unit may be substantially the same as an embodiment of the backlight unit described above. Therefore, any repetitive detailed description thereof will be omitted.

The display panel PA may include a display region and a non-display region. In an embodiment, the display panel PA may include a first substrate 500, a second substrate 1000 facing the first substrate 500, and a liquid crystal layer (not illustrated) disposed between the first substrate 500 and the second substrate.

In an embodiment, the first substrate 500 may be an array substrate including a plurality of transistors disposed on a base substrate thereof, and the second substrate 1000 may be a color filter substrate including a color filter disposed on a base substrate thereof.

In an alternative embodiment, the color filter may be in the first substrate 500. In such an embodiment, the display panel may be a display panel having a color filter on array ("COA") structure.

In an embodiment, the first substrate 500 and/or the second substrate 1000 may include or be made of glass.

In an embodiment, at least a part of the first substrate 500 may overlap the second substrate 1000. In such an embodiment, a driving unit (not illustrated), a printed circuit board (not illustrated) and the like may be disposed on the base substrate of the first substrate 500 in a region that does not overlap the second substrate 1000.

In an embodiment, the first substrate 500 may have a size or an area larger than that of the second substrate 1000. However, the invention is not limited thereto. In an alternative embodiment, the second substrate 1000 may have a size or an area larger than that of the first substrate 500.

Figure 27:
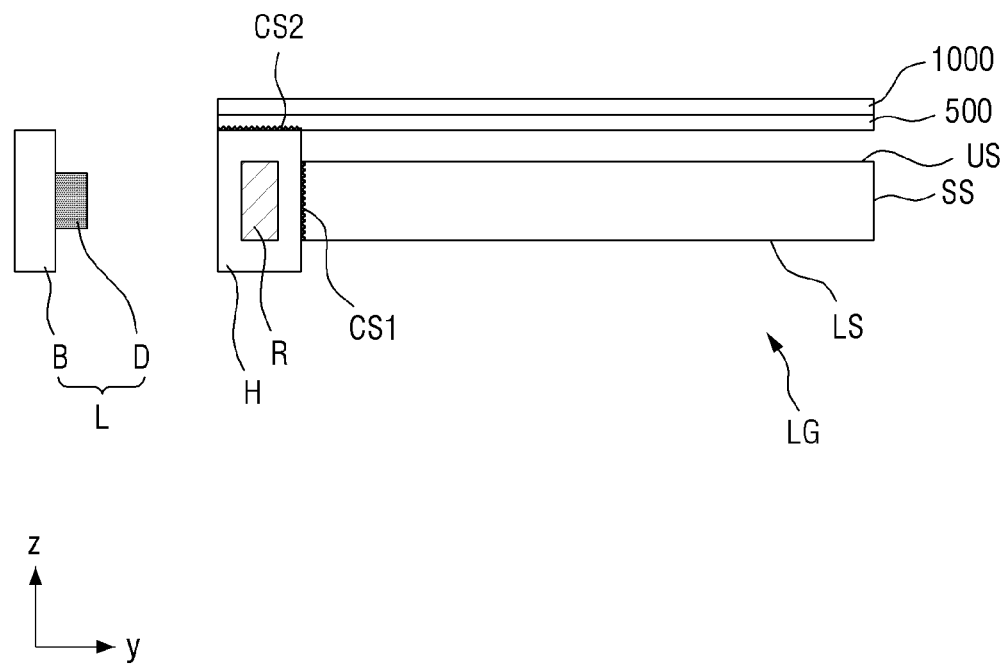
FIG. 27 is a cross-sectional view of a display device according to an alternative embodiment of the invention.

FIG. 27 is a cross-sectional view of a display device according to an alternative embodiment of the invention. Referring to FIG. 27, such an embodiment of a display device is substantially the same as the embodiment of a display device described above with reference to FIG. 26 except that the housing H is bonded to the first substrate 500.

In an embodiment, the light guide plate LG and the side surfaces of the housing H may come into contact with each other to form a first contact surface CS1, and the lower surface of the first substrate 500 and the upper surface of the housing H may come into contact with each other to form the second contact surface CS2.

A bonding portion (not illustrated) may be formed on the first contact surface CS1 and the second contact surface CS2. The bonding portion may be substantially the same as that described above with reference to FIGS. 3 and 4.

In such an embodiment, as described above, when the housing H comes into direct contact with the first substrate 500 and the light guide plate LG, the misalignment between the wavelength conversion member R disposed in the housing H and the light guide plate LG may be effectively prevented, and, the number of parts included in the module may be reduced by integrally forming the housing H, the first substrate 500 and the light guide plate LG.

Figure 28:
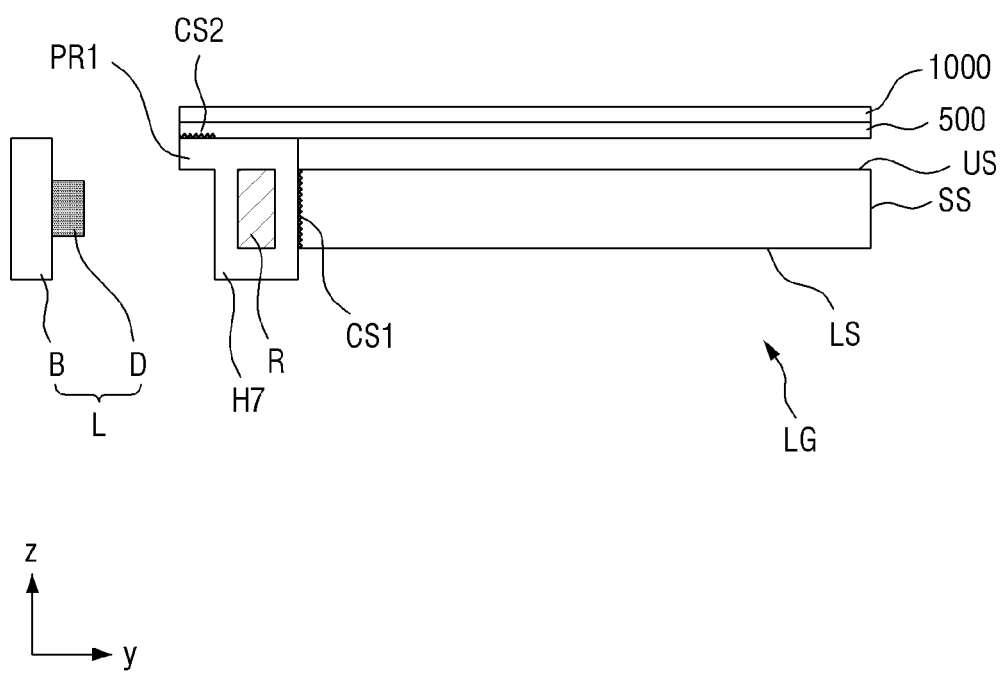
FIG. 28 is a cross-sectional view of a display device according to another alternative embodiment of the invention.

FIG. 28 is a cross-sectional view of a display device according to another alternative embodiment of the invention. Referring to FIG. 28, such an embodiment of a display device is substantially the same as the embodiment of a display device described above with reference to FIG. 26 except that a first protrusion PR1 is formed on one side of the housing H7.

In an embodiment, the first protrusion PR1 may be formed to protrude from the housing H7 toward the light source L.

In an embodiment, the first protrusion PR1 may be formed integrally with the housing H7. In an embodiment in which the housing H7 is formed of glass, the first protrusion PR1 is formed of glass similar to the housing H7 and may be transparent.

In an embodiment, the first protrusion PR1 and the housing H7 may have an overall 'L' shape.

In an embodiment, where the display device includes the first protrusion PR1, the housing H7 and the light guide plate LG may come into contact with each other to form the first contact surface CS1, and the first protrusion PR1 and the first substrate 500 may come into contact with each other to form the second contact surface CS2.

A bonding portion (not illustrated) may be formed on the first contact surface CS1 and the second contact surface CS2. The bonding portion may be substantially the same as that described above with reference to FIGS. 3 and 4.

In an embodiment, the second contact surface CS2 may not overlap the wavelength conversion member R. In an embodiment, the bonding portion (not illustrated) of the second contact surface CS2 may be formed by irradiating the laser from the bottom of the light guide plate LG in the positive direction of the z-axis. In such an embodiment, when the laser passes through the wavelength conversion member R, the wavelength conversion member R may be damaged by heat. However, as illustrated in FIG. 28, in an embodiment, the second contact surface CS2 R is formed not to overlap the wavelength conversion member R, and the irradiated laser may form the bonding portion without passing through the wavelength conversion member R, such that the wavelength conversion member R is effectively prevented from being degraded by thermal damage.

Figure 29:
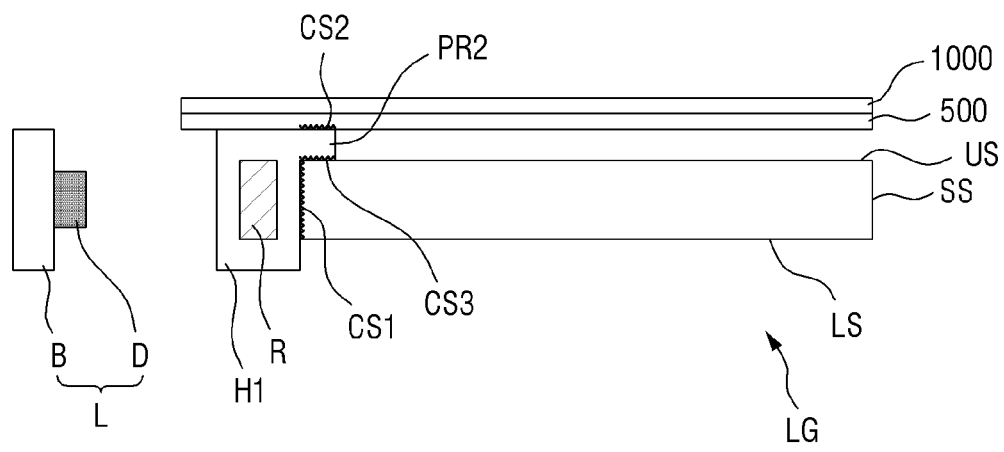
FIG. 29 is a cross-sectional view of a display device according to another alternative embodiment of the invention.

FIG. 29 is a cross-sectional view of a display device according to another alternative embodiment of the invention.

Referring to FIG. 29, such an embodiment of a display device is substantially the same as the embodiment of a display device described above with reference to FIG. 26 except that a second protrusion PR2 is formed on a side surface of the housing H1.

The second protrusion PR2 may be formed to protrude in a direction opposite to the first protrusion PR1, that is, toward the light guide plate LG from the housing H1.

In an embodiment, the second protrusion PR2 may be formed integrally with the housing H1. In an exemplary embodiment in which the housing H1 is formed of glass, the second protrusion PR2 may be made of glass similar to the housing H1 and may be transparent.

In an embodiment, the second protrusion PR2 and the housing H1 may have an overall 'L' shape.

In an embodiment, the second protrusion PR2 may come into contact with the first substrate 500 and the light guide plate LG. In such an embodiment, the second protrusion PR2 and the first substrate 500 may come into contact with each other to form a second contact surface CS2, and the second protrusion PR2 and the upper surface US of the light guide plate LG may come into contact with each other to form a third contact surface CS3.

A bonding portion (not illustrated) may be formed on the first contact surface CS1 to the third contact surface CS3. The bonding portion may be substantially the same as that described above with reference to FIGS. 3 and 4.

Figure 30:
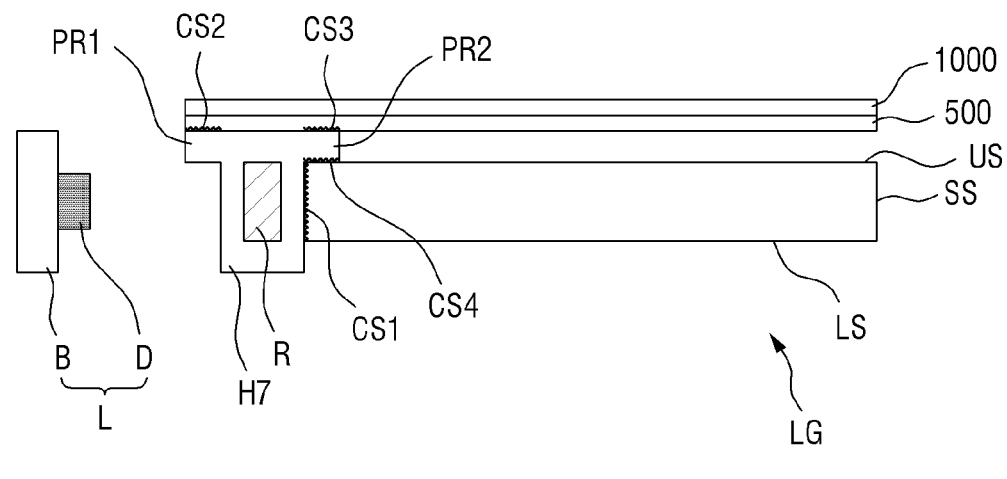
FIG. 30 is a cross-sectional view of a display device according to another alternative embodiment of the invention.

FIG. 30 is a cross-sectional view of a display device according to another alternative embodiment of the invention.

Referring to FIG. 30, such an embodiment of a display device is substantially the same as the embodiment of a display device described above with reference to FIG. 26 except that a first protrusion PR1 and a second protrusion PR2 are formed on both of opposing sides of a housing H7.

The first protrusion PR1 may be substantially the same as that described above with reference to FIG. 28, and the second protrusion PR2 may be substantially the same as that described above with reference to FIG. 29.

In an embodiment, the first protrusion PR1, the second protrusion PR2 and the housing H7 may be integrally formed and may have an overall 'T' shape.

In an embodiment, the housing H7 and the side surface SS of the light guide plate LG may come into contact each other to form the first contact surface, the first protrusion PR1 may come into contact with the first substrate 500 to form the second contact surface CS2, the second protrusion PR2 may come into contact with the first substrate 500 to form the third contact surface CS3, and the second protrusion PR2 and the upper surface US of the light guide plate LG may come into contact with each other to form the fourth contact surface CS4.

A bonding portion (not illustrated) may be formed on the first contact surface CS1 to the fourth contact surface CS4. The bonding portion may be substantially the same as that described above with reference to FIGS. 3 and 4.

In an embodiment, the second contact surface CS2, the third contact surface CS3 and the fourth contact surface CS4 may not overlap the wavelength conversion member R. In an embodiment, the bonding portions of the second contact surface CS2, the third contact surface CS3 and the fourth contact surface CS4 may be formed by irradiating laser from the bottom of the light guide plate LG in the positive direction of the z-axis. In such an embodiment, when the laser passes through the wavelength conversion member R, the wavelength conversion member R may be damaged by heat. However, as illustrated in FIG. 30, in such an embodiment, the second contact surface CS2, the third contact surface CS3 and the fourth contact surface CS4 are formed not to overlap the wavelength conversion member R, and the bonding portions can be formed in a state in which the irradiated laser does not pass through the wavelength conversion member R, such that the wavelength conversion member R may be effectively prevented from being degraded by thermal damage.

Figure 31:
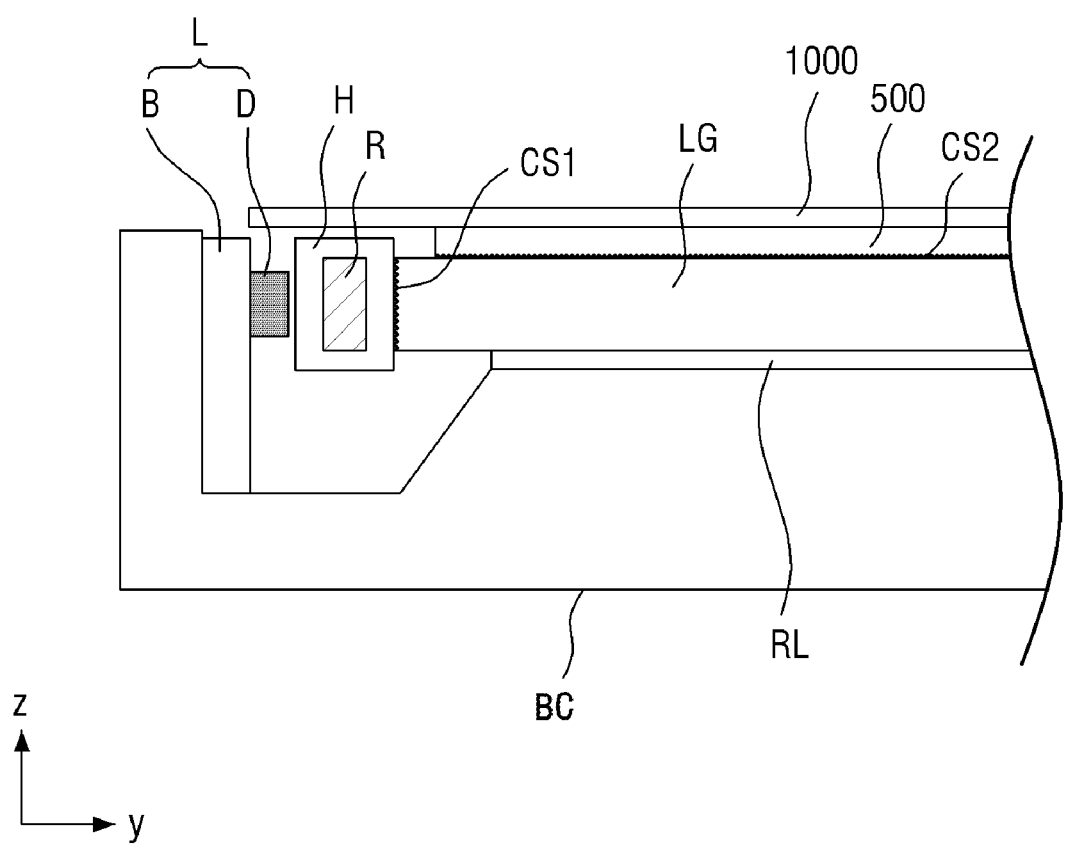
FIG. 31 is a cross-sectional view of a display device according to another alternative embodiment of the invention.

FIG. 31 is a cross-sectional view of a display device according to another alternative embodiment of the invention.

Referring to FIG. 31, such an embodiment of a display device is substantially the same as the embodiment of a display device described above with reference to FIG. 26 except that the display device further includes a lower cover BC that houses a light source L.

In an embodiment, the display device may further include the lower cover BC that houses the light source L. The lower cover BC supports the light guide plate LG and may provide a space which houses the light guide plate LG.

In an embodiment, a reflective layer RL may be disposed between the lower cover BC and the light guide plate LG. The reflective layer RL may serve to reflect the light having passed through the lower surface LS of the light guide plate LG back toward the upper surface US. The reflective layer RL may perform specular reflection and/or diffuse reflection.

In an embodiment, the reflective layer RL may have a sheet form. In an embodiment, a plurality of functional patterns may be defined or formed on the reflective layer RL.

In an embodiment, the light guide plate LG and the first substrate 500 may be directly in contact with each other.

In such an embodiment, the first contact surface CS1 may be formed by contact between the housing H and the side surface SS of the light guide plate LG, and the second contact surface CS2 may be formed by contact between the first substrate 500 and the upper surface US of the light guide plate LG.

A bonding portion (not illustrated) may be formed on the first contact surface CS1 and the second contact surface CS2. The bonding portion may be substantially the same as that described above with reference to FIGS. 3 and 4.

In such an embodiment, when the light guide plate LG and the first substrate 500 come into direct contact with each other, the bonding portion may be formed not to overlap the display region of the display panel, that is, to overlap the non-display region.

In such an embodiment, where the light guide plate LG and the first substrate 500 are bonded to each other, the module may have a simplified structure by reducing the number of parts include in the display device.

Figure 32:
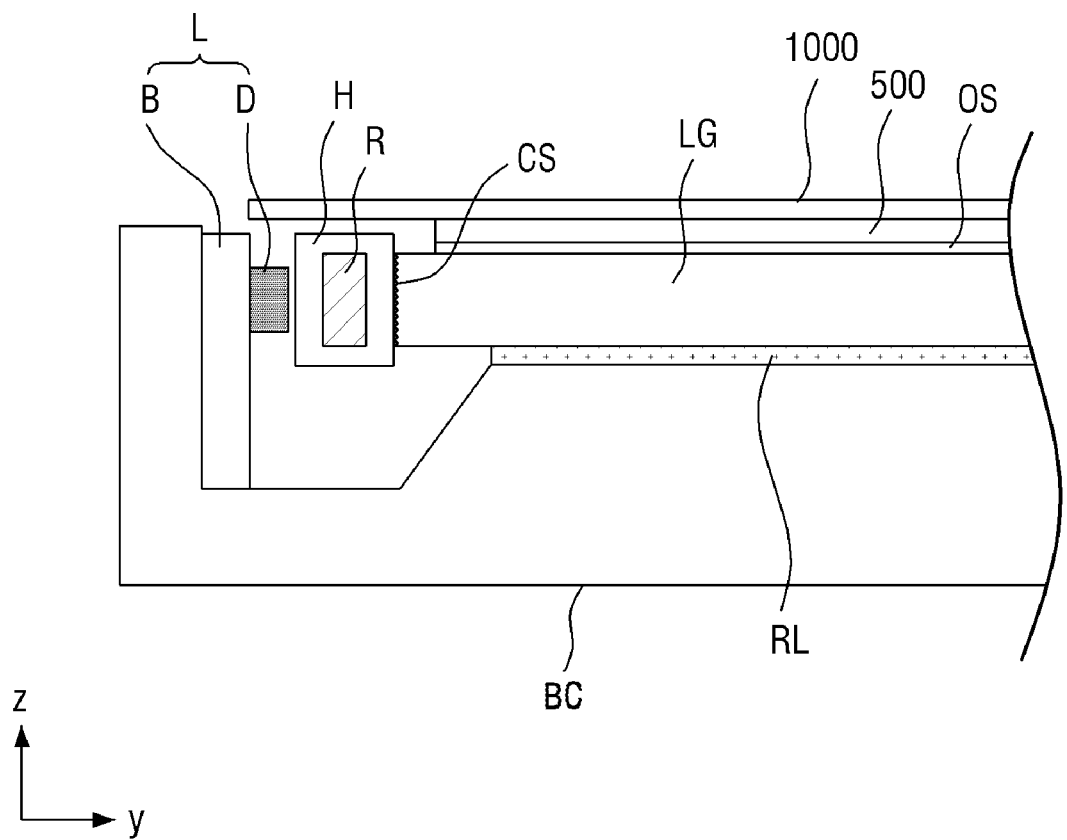
FIG. 32 is a cross-sectional view of a display device according to another alternative embodiment of the invention.

FIG. 32 is a cross-sectional view of a display device according to another alternative embodiment of the invention. Referring to FIG. 32, such an embodiment of a display device is substantially the same as the embodiment of a display device described above with reference to FIG. 31 except that an optical sheet OS is interposed between the first substrate 500 and the light guide plate LG.

In an embodiment, at least one optical sheet OS may be disposed between the first substrate 500 and the light guide plate LG.

In an embodiment, the optical sheet OS is a single sheet, and may be a composite functional optical sheet OS which performs multiple functions such as scattering and diffusion.

In an alternative embodiment, the optical sheet OS may be provided in plural, and each optical sheet OS may perform functions independent of each other.

Figure 33:
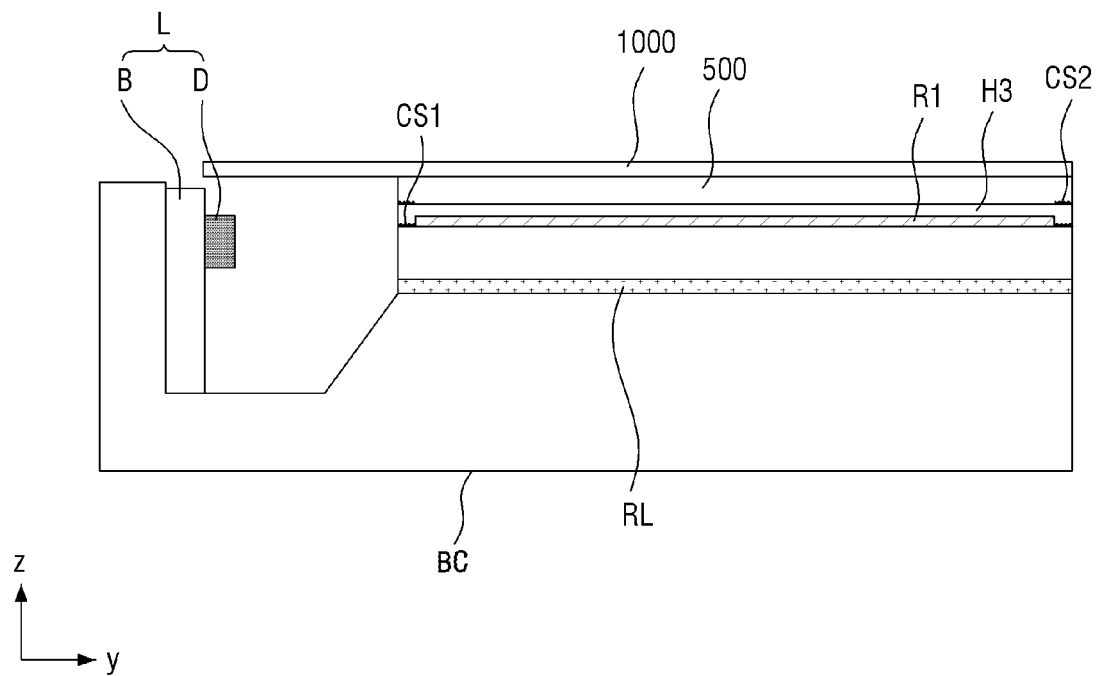
FIG. 33 is a cross-sectional view of a display device according to another alternative embodiment of the invention.

FIG. 33 is a cross-sectional view of a display device according to another alternative embodiment of the invention.

Referring to FIG. 33, such an embodiment of a display device is substantially the same as the embodiment of a display device described above with reference to FIG. 26 except that a wavelength conversion member R1 and a housing H3 are disposed on the upper surface US of the light guide plate LG, and a first substrate 500 is disposed on the housing H3.

In FIG. 33, the backlight unit may be substantially the same as that described above with reference to FIGS. 12 and 13. Therefore, any repetitive detailed description thereof will be omitted.

In such an embodiment, as described above, the housing H3 and the upper surface of the light guide plate LG may come into contact with each other to form the first contact surface CS1.

The first substrate 500 may be disposed on the housing H3. The first substrate 500 and the housing H3 come into contact with each other and may be bonded to each other. As a result, the first substrate 500 and the housing H3 may come into contact with each other to form the second contact surface CS2.

In an embodiment, the second contact surface CS2 may be formed to overlap the first contact surface CS1. In such an embodiment, similarly to the first contact surface CS1 described above, the second contact surface CS2 may be arranged not to overlap the wavelength conversion member R1.

In such an embodiment, when the second contact surface CS2 is formed to overlap the wavelength conversion member R1, the wavelength conversion member R1 is effectively prevented from being thermally damaged by laser, in the process of forming the bonding portion on the second contact surface CS2.

Hereinafter, a method of manufacturing a display device according to an embodiment of the invention will be described. Some of the configurations described below are the same as those of the liquid crystal display device described above, and any repetitive detailed descriptions thereof will be omitted for convenience of description.

Figure 34:
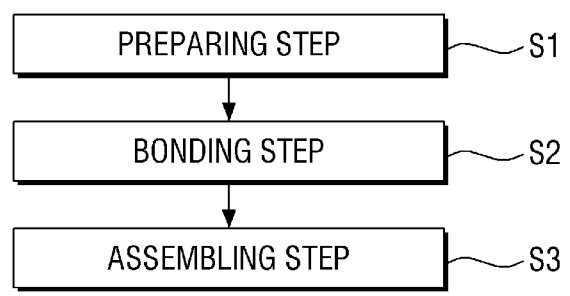
FIG. 34 is a flowchart of a method of manufacturing a display device according to an embodiment of the invention.

FIG. 34 is a flowchart of a method for manufacturing a display device according to an embodiment of the invention.

Referring to FIG. 34, an embodiment of the method for manufacturing the display device includes preparing a light guide plate LG, a wavelength conversion member R to be disposed on a surface of the light guide plate LG, and a housing H which houses the wavelength conversion member R and is to be in contact with the light guide plate LG (S1); bonding the light guide plate LG and the housing H using a femtosecond laser (S2); and may further include assembling the bonded light guide plate LG and the housing H with the lower cover BC (S3).

First, the process (S1) of preparing the light guide plate LG, the wavelength conversion member R disposed on one side of the light guide plate LG, and the housing H which houses the wavelength conversion member R and comes into contact with the light guide plate LG is performed.

The light guide plate LG, the wavelength conversion member R and the housing H may be substantially the same as those in the backlight unit described above. Therefore, the detailed description thereof will be omitted.

Subsequently, the process (S2) of forming the light guide plate-housing assembly by the bonding the light guide plate LG and the housing H using the femtosecond laser may be performed.

In such an embodiment, such a process (S2) may include irradiating the contact surface CS between the light guide plate LG made of glass and the housing H with the femtosecond laser. When the contact surface CS between the light guide plate LG and the housing H is irradiated with the femtosecond laser, a bonding portion BP including the bonding dot BD may be formed on the contact surface CS.

The position of the contact surface may be substantially the same as that in the backlight unit described above.

In an embodiment, where the femtosecond laser is used, the size of the bonding dots BD is about 100 μm or less, and the specific content is as described above with reference to FIG. 4.

In such an embodiment including using the femtosecond laser, the light guide plate LG made of glass is directly bonded with the housing H. In such an embodiment, the portions of the light guide plate LG and the housing H irradiated by the femtosecond laser may be at least partially melted and fused. In such an embodiment, no other substance is provided between the light guide plate LG and the housing H, and the light guide plate LG and the housing H may be bonded directly in contact with each other.

In an embodiment, the method for manufacturing the display device may further include a process of bonding the display panel PA to the light guide plate LG and the housing H bonded to each other.

The process of bonding the bonded light guide plate LG, the housing H and the display panel PA may include a process of bonding the housing H and/or the light guide plate LG and the first substrate 500.

The process of bonding the housing H and/or the light guide plate LG and the first substrate 500 may include a process of forming a bonding portion on the contact surface between the housing H and/or the light guide plate LG and the first substrate 500. The position of the contact surface may be substantially the same as that described above with reference to FIGS. 26 to 33.

Subsequently, the process (S3) of assembling the bonded light guide plate LG, the housing H and the display panel PA with the lower cover BC may be performed.

Figure 35:
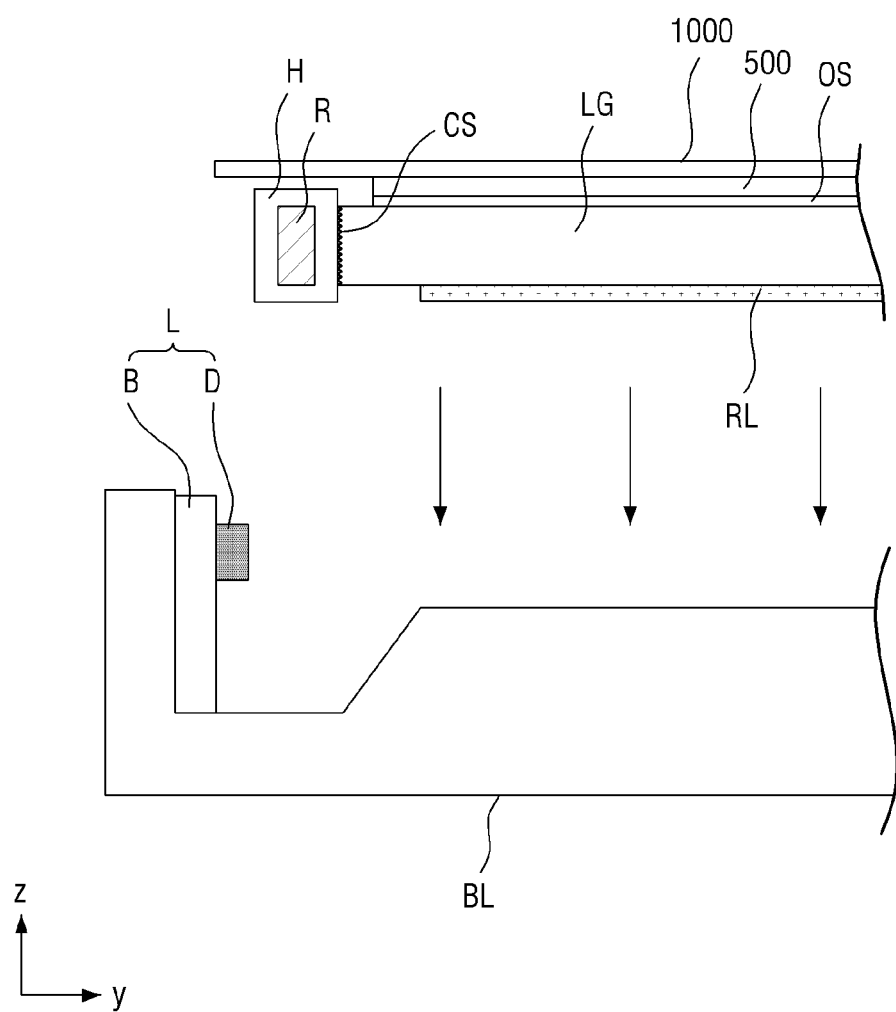
FIG. 35 is a cross-sectional view for explaining a method for manufacturing the display device according to an embodiment of the invention.

FIG. 35 is a cross-sectional view for explaining the method for manufacturing the display device according to an embodiment of the invention.

FIG. 35 illustrates the process of assembling the bonded light guide plate LG, the housing H and the display panel PA with the lower cover BC.

The bonded light guide plate LG, the housing H and the display panel PA may be substantially the same as those in the display device described above. In an embodiment, the bonded light guide plate LG, the housing H and the display panel PA may be replaced with those described above with reference to FIGS. 26 to 33.

The lower cover BC may house the light source L. The bonded light guide plate LG, the housing H and the display panel PA may be assembled with the lower cover BC for housing the light source L.

In an embodiment, as described above, when assembling the integrated light guide plate LG, the housing H, the display panel PA and the lower cover BC for housing the light source L, the number of parts included in the module can be reduced, the assembly process may be simplified, and the productivity may be improved.

While the invention has been particularly illustrated and described with reference to exemplary embodiments thereof, it will be understood by those of ordinary skill in the art that various changes in form and detail may be made therein without departing from the spirit and scope of the invention as defined by the following claims. The exemplary embodiments should be considered in a descriptive sense only and not for purposes of limitation.

What is claimed is:

1. A backlight unit comprising:
    a light guide plate comprising an upper surface, a lower surface facing the upper surface, and a side surface which connects the upper surface with the lower surface;
    a wavelength conversion member disposed on a surface of the light guide plate; and
    a housing which houses the wavelength conversion member,
    wherein the light guide plate and the housing are fused each other.

2. The backlight unit of claim 1, wherein the housing is fused to the side surface of the light guide plate.

3. The backlight unit of claim 2, wherein
    the housing comprises a protrusion protruded from a side surface thereof, wherein the protrusion is fused to the upper surface of the light guide plate.

4. The backlight unit of claim 2, wherein the side surface of the light guide plate is in contact with the housing and the wavelength conversion member.

5. The backlight unit of claim 4, wherein
a groove is defined on the side surface of the light guide plate,
wherein the wavelength conversion member is filled in the groove on the side surface of the light guide plate.

6. The backlight unit of claim 1, wherein the housing is fused to the upper surface.

7. The backlight unit of claim 6, further comprising:
a groove is defined on the upper surface of the light guide plate,
wherein the wavelength conversion member is filled in the groove on the upper surface of the light guide plate.

8. The backlight unit of claim 1, wherein
the housing and the side surface of the light guide plate are directly in contact with each other to form a contact surface, and
a bonding portion of the housing and the light guide plate is formed on the contact surface.

9. The backlight unit of claim 8, wherein the bonding portion comprises a plurality of bonding dots.

10. The backlight unit of claim 9, wherein each of the bonding dots comprises a central region and a peripheral region disposed outside the central region.

11. The backlight unit of claim 10, wherein a width of the central region is in a range of about 10 micrometers to about 20 micrometers.

12. The backlight unit of claim 11, wherein a width of the peripheral region is in a range of about 70 micrometers to about 100 micrometers.

13. The backlight unit of claim 1, wherein
a plurality of trenches is defined in the housing,
wherein the wavelength conversion member is filled in the trenches.

14. The backlight unit of claim 13, wherein the housing comprises a cover glass which covers the trenches.

15. The backlight unit of claim 1, wherein the light guide plate and the housing comprise a glass.

16. A display device comprising:
a backlight unit; and
a display panel disposed on the backlight unit,
wherein the backlight unit comprises:
a light guide plate comprising an upper surface, a lower surface facing the upper surface, and a side surface which connects the upper surface with the lower surface;
a wavelength conversion member disposed on a surface of the light guide plate; and
a housing which houses the wavelength conversion member, wherein the light guide plate and the housing are fused each other.

17. The display device of claim 16, wherein the housing is bonded to the display panel.

18. The display device of claim 17, wherein
the housing comprises a first protrusion protruded from a surface thereof,
wherein the first protrusion is fused to the display panel.

19. The display device of claim 18, wherein
the housing further comprises a second protrusion protruded from an opposing surface thereof, which is opposite to the surface,
wherein the second protrusion is fused to the display panel.

20. The display device of claim 16, wherein the light guide plate is fused to the display panel.

21. The display device of claim 16, wherein
the housing is fused to the upper surface of the light guide plate, and
the display panel is fused to the housing.

* * * * *